US012016252B2

(12) United States Patent
Daraeizadeh et al.

(10) Patent No.: US 12,016,252 B2
(45) Date of Patent: Jun. 18, 2024

(54) SYSTEM AND METHOD FOR AUTOMATIC REAL-TIME CALIBRATION OF QUBIT CHIPS

(71) Applicant: Intel Corporation, Santa Clara, CA (US)

(72) Inventors: Sahar Daraeizadeh, Lake Oswego, OR (US); Shavindra Premaratne, Portland, OR (US); Anindya Sankar Paul, Portland, OR (US); Anne Y. Matsuura, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 662 days.

(21) Appl. No.: 17/133,604

(22) Filed: Dec. 23, 2020

(65) Prior Publication Data

US 2022/0199888 A1 Jun. 23, 2022

(51) Int. Cl.
*G06N 10/00* (2022.01)
*G06N 20/00* (2019.01)
*H10N 60/12* (2023.01)

(52) U.S. Cl.
CPC ............. *H10N 60/12* (2023.02); *G06N 10/00* (2019.01); *G06N 20/00* (2019.01)

(58) Field of Classification Search
None
See application file for complete search history.

(56) References Cited

U.S. PATENT DOCUMENTS

| 2019/0042392 A1* | 2/2019 | Matsuura | G06N 10/00 |
| 2019/0042974 A1* | 2/2019 | Daraeizadeh | G06N 7/01 |
| 2020/0201379 A1* | 6/2020 | Hogaboam | G06F 1/06 |
| 2020/0242208 A1* | 7/2020 | Daraeizadeh | G06F 30/30 |

(Continued)

FOREIGN PATENT DOCUMENTS

| WO | 2020/005417 A1 | 1/2020 | |
| WO | WO-2020088297 A1 * | 5/2020 | G06N 10/00 |

OTHER PUBLICATIONS

European Search Report and Search Opinion, EP App. No. 21198309.3, dated Apr. 5, 2022, 14 pages.

(Continued)

*Primary Examiner* — Michael Lebentritt
(74) *Attorney, Agent, or Firm* — Nicholson De Vos Webster & Elliott LLP

(57) ABSTRACT

Apparatus and methods for real time calibration of qubits in a quantum processor. For example, one embodiment of an apparatus comprises: a quantum processor comprising a plurality of qubits, each of the qubits having a state; a quantum controller to generate sequences of electromagnetic (EM) pulses to manipulate the states of the plurality of qubits based on a set of control parameters; a qubit measurement unit to measure one or more sensors associated with a corresponding one or more of the qubits of the plurality of qubits to produce one or more corresponding measured values; and a machine-learning engine to evaluate the one or more measured values in accordance with a machine-learning process to generate updated control parameters, wherein the quantum controller is to use the updated control parameters to generate subsequent sequences of EM pulses to manipulate the states of the plurality of qubits.

26 Claims, 19 Drawing Sheets

(56) References Cited

U.S. PATENT DOCUMENTS

| | | | | |
|---|---|---|---|---|
| 2021/0182723 A1* | 6/2021 | Schmitz | ................ | G06N 10/40 |
| 2022/0199888 A1* | 6/2022 | Daraeizadeh | .......... | G06N 10/00 |
| 2022/0343039 A1* | 10/2022 | Matsuura | ............... | G06N 10/20 |
| 2023/0016817 A1* | 1/2023 | Premaratne | ............ | G06N 10/20 |

OTHER PUBLICATIONS

Fosel et al., "Reinforcement Learning with Neural Networks for Quantum Feedback", arxiv.org, Cornell University Library, Feb. 14, 2018, pp. 1-46.

Han et al., "Generalizable control for quantum parameter estimation through reinforcement learning", npj quantum information, Oct. 4, 2019, pp. 1-8.

Taske et al., "A machine learning approach for automated fine-tuning of semiconductor spin qubits", Applied physics letters, vol. 114, No. 13, Apr. 2, 2019, pp. 133102.

Wittler et al., "An integrated tool-set for Control, Calibration and Characterization of quantum devices applied to superconducting qubits", arxiv.org, Cornell University Library, Oct. 7, 2020, pp. 1-9.

\* cited by examiner

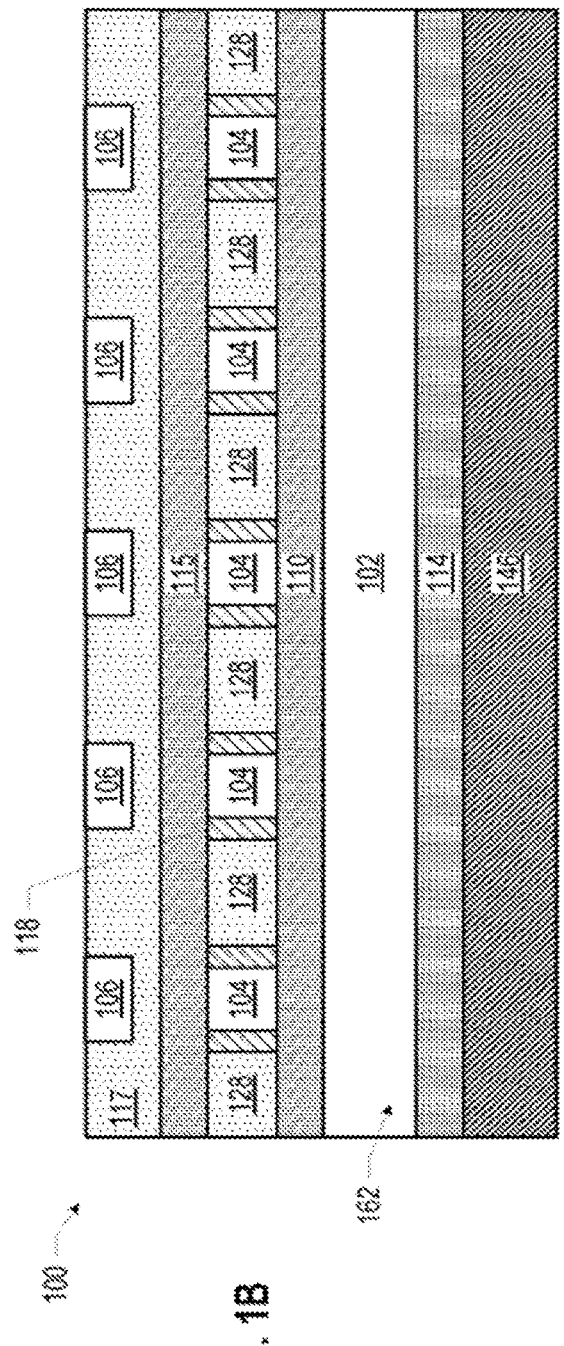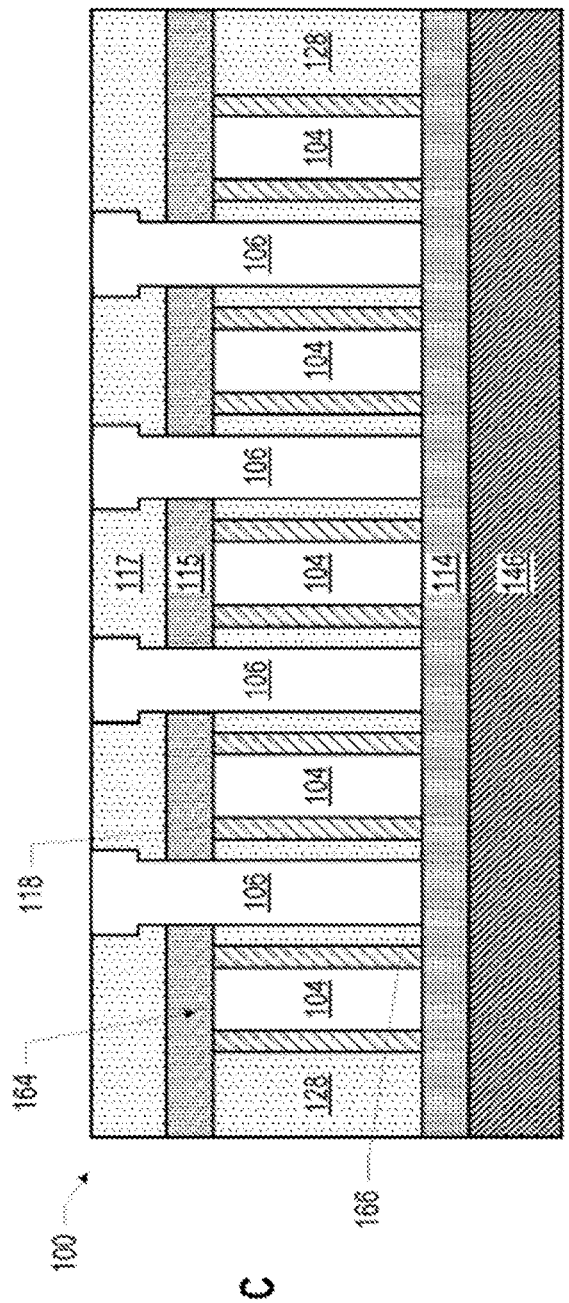

```
for k from 0 to MR-1 do
  for i from 0 to NQ-1 do
    h_x[i] ← random real number within [-1, 1]    # floating point op
    h_y[i] ← random real number within [-1, 1]    # floating point op
    a[i] ← 0
  end for
  for j from 0 to MP-1 do
    for i from 0 to NQ-1 do
      Initialize(q[i])                             # quantum op, "Qu-Op Analog Signal Generator"
    end for
    prep params (h_x, h_y, ...)                    # floating point op
    for i from 0 to NT-1 do
      Q(params)    # Figure 3, "Quantum circuit for many-body disordered Hamiltonian"
    end for
    for i from 0 to NQ-1 do
      a[i] ← a[i] + Measure(q[i])                  # quantum op, "Qubit measurement"
    end for
  end for
  for i from 0 to NQ-1 do
    Pr[i] ← a[i] / MP;                             # floating point op
  end for
  compute system properties from Pr.              # floating point op
end for
```

*FIG. 5B*

SYSTEM AND METHOD FOR AUTOMATIC REAL-TIME CALIBRATION OF QUBIT CHIPS

BACKGROUND

Field of the Invention

The embodiments of the invention relate generally to the field of quantum computing. More particularly, these embodiments relate to techniques for automatic real-time calibration of a qubit chips.

Description of the Related Art

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

A better understanding of the present invention can be obtained from the following detailed description in conjunction with the following drawings, in which:

FIGS. 1A-1F illustrate various views of an example quantum dot device, in accordance with one embodiment;

FIGS. 5A-B illustrate an example quantum circuit and program code to implement the quantum circuit;

DETAILED DESCRIPTION

Figure 1A:
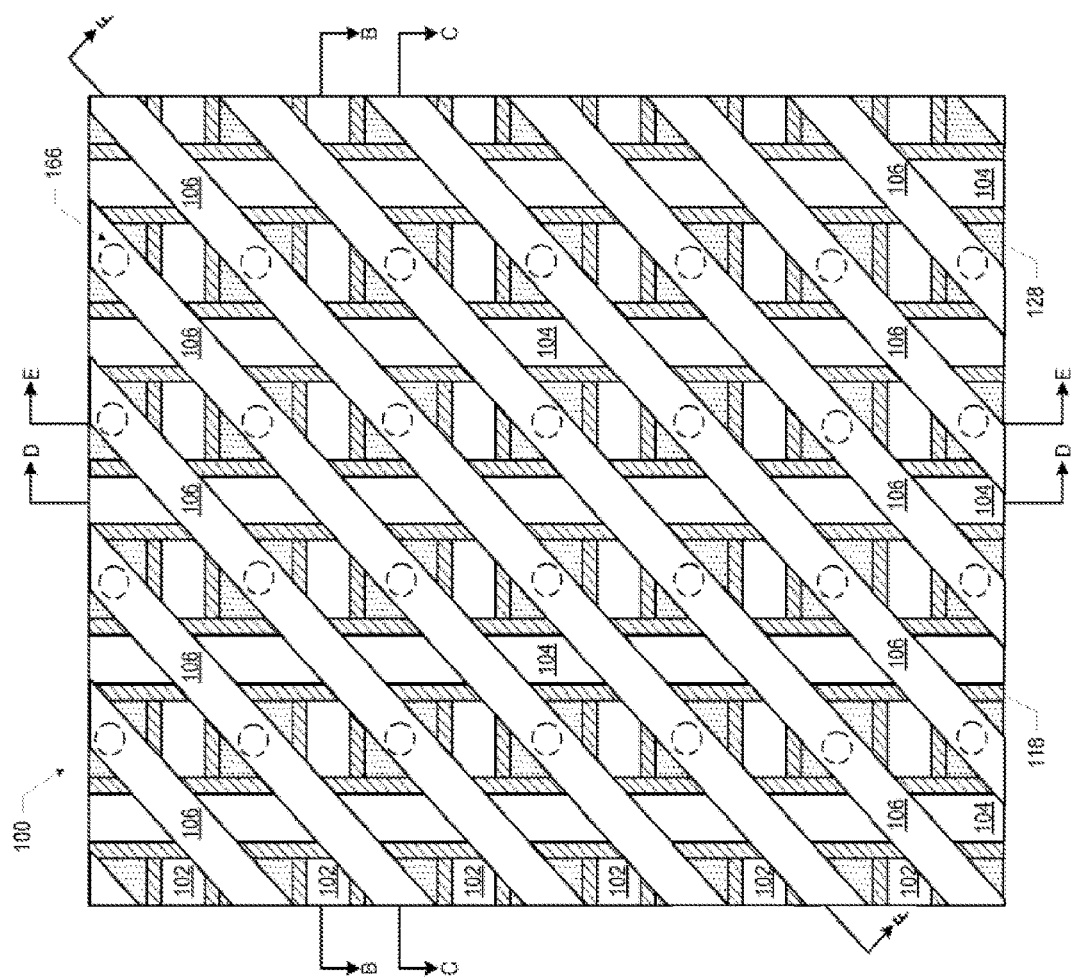

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

INTRODUCTION

A quantum computer uses quantum-mechanical phenomena such as superposition and entanglement to perform computations. In contrast to digital computers which store data in one of two definite states (0 or 1), quantum computation uses quantum bits (qbits), which can be in superpositions of states. Qubits may be implemented using physically distinguishable quantum states of elementary particles such as electrons and photons. For example, the polarization of a photon may be used where the two states are vertical polarization and horizontal polarization. Similarly, the spin of an electron may have distinguishable states such as "up spin" and "down spin."

Qubit states are typically represented by the bracket notations $|0\rangle$ and $|1\rangle$. In a traditional computer system, a bit is exclusively in one state or the other, i.e., a '0' or a '1.' However, qbits in quantum mechanical systems can be in a superposition of both states at the same time, a trait that is unique and fundamental to quantum computing.

Quantum computing systems execute algorithms containing quantum logic operations performed on qubits. The sequence of operations is statically compiled into a schedule and the qubits are addressed using an indexing scheme. This algorithm is then executed a sufficiently large number of times until the confidence interval of the computed answer is above a threshold (e.g., ~95+%). Hitting the threshold means that the desired algorithmic result has been reached.

Qubits have been implemented using a variety of different technologies which are capable of manipulating and reading quantum states. These include, but are not limited to quantum dot devices (spin based and spatial based), trapped-ion devices, superconducting quantum computers, optical lattices, nuclear magnetic resonance computers, solid-state NMR Kane quantum devices, electrons-on-helium quantum computers, cavity quantum electrodynamics (CQED) devices, molecular magnet computers, and fullerene-based ESR quantum computers, to name a few. Thus, while a quantum dot device is described below in relation to certain embodiments of the invention, the underlying principles of the invention may be employed in combination with any type of quantum computer including, but not limited to, those listed above. The particular physical implementation used for qbits is orthogonal to the embodiments of the invention described herein.

Quantum Dot Devices

Quantum dots are small semiconductor particles, typically a few nanometers in size. Because of this small size, quantum dots operate according to the rules of quantum mechanics, having optical and electronic properties which differ from macroscopic entities. Quantum dots are sometimes referred to as "artificial atoms" to connote the fact that a quantum dot is a single object with discrete, bound electronic states, as is the case with atoms or molecules.

Figure 1D:
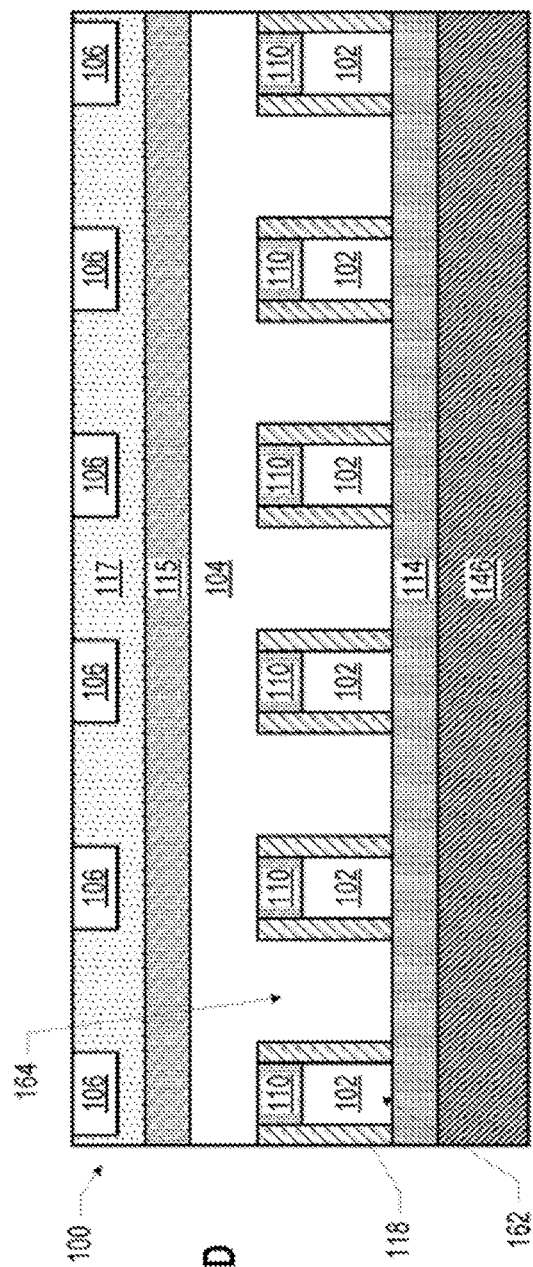
Figure 1E:
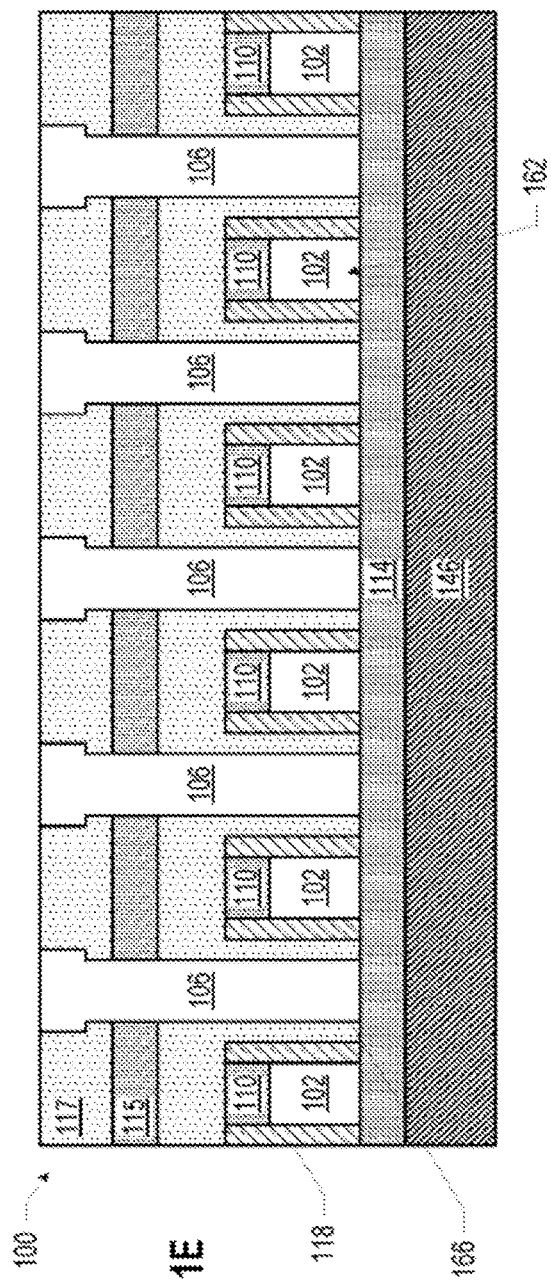
Figure 1F:
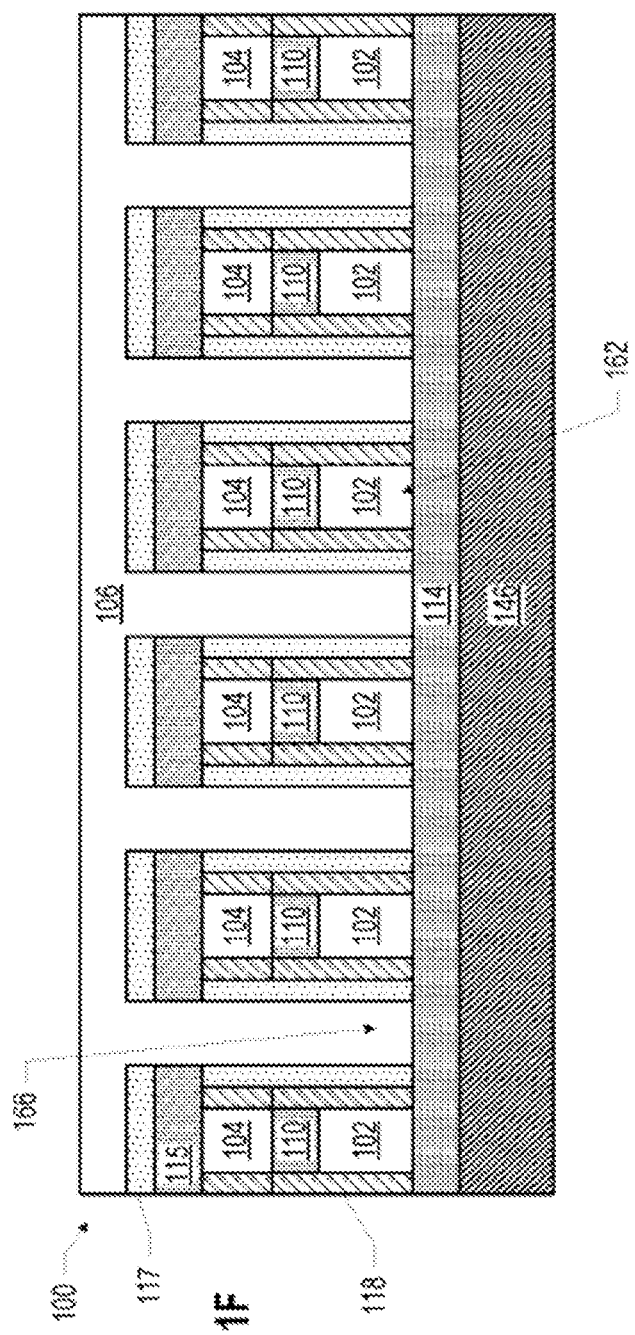

FIGS. 1A-1F are various views of a quantum dot device 100, which may be used with embodiments of the invention described below. FIG. 1A is a top view of a portion of the quantum dot device 100 with some of the materials removed so that the first gate lines 102, the second gate lines 104, and the third gate lines 106 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 1B-1F are side cross-sectional views of the quantum dot device 100 of FIG. 1A; in particular, FIG. 1B is a view through the section B-B of FIG. 1A, FIG. 1C is a view through the section C-C of FIG. 1A, FIG. 1D is a view through the section D-D of FIG. 1A, FIG. 1E is a view through the section E-E of FIG. 1A, and FIG. 1F is a view through the section F-F of FIG. 1A.

The quantum dot device 100 of FIG. 1 may be operated in any of a number of ways. For example, in some embodiments, electrical signals such as voltages, currents, radio frequency (RF), and/or microwave signals, may be provided to one or more first gate line 102, second gate line 104, and/or third gate line 106 to cause a quantum dot (e.g., an electron spin-based quantum dot or a hole spin-based quantum dot) to form in a quantum well stack 146 under a third gate 166 of a third gate line 106. Electrical signals provided to a third gate line 106 may control the electrical potential of a quantum well under the third gates 166 of that third gate line 106, while electrical signals provided to a first gate line 102 (and/or a second gate line 104) may control the potential energy barrier under the first gates 162 of that first gate line 102 (and/or the second gates 164 of that second gate line 104) between adjacent quantum wells. Quantum interactions between quantum dots in different quantum wells in the quantum well stack 146 (e.g., under different quantum dot gates) may be controlled in part by the potential energy barrier provided by the barrier potentials imposed between them (e.g., by intervening barrier gates).

Generally, the quantum dot devices 100 disclosed herein may further include a source of magnetic fields (not shown) that may be used to create an energy difference in the states of a quantum dot (e.g., the spin states of an electron spin-based quantum dot) that are normally degenerate, and the states of the quantum dots (e.g., the spin states) may be manipulated by applying electromagnetic energy to the gates lines to create quantum bits capable of computation. The source of magnetic fields may be one or more magnet lines, as discussed below. Thus, the quantum dot devices 100 disclosed herein may, through controlled application of electromagnetic energy, be able to manipulate the position, number, and quantum state (e.g., spin) of quantum dots in the quantum well stack 146.

In the quantum dot device 100 of FIG. 1, a gate dielectric 114 may be disposed on a quantum well stack 146. A quantum well stack 146 may include at least one quantum well layer 152 (not shown in FIG. 1) in which quantum dots may be localized during operation of the quantum dot device 100. The gate dielectric 114 may be any suitable material, such as a high-k material. Multiple parallel first gate lines 102 may be disposed on the gate dielectric 114, and spacer material 118 may be disposed on side faces of the first gate lines 102. In some embodiments, a patterned hardmask 110 may be disposed on the first gate lines 102 (with the pattern corresponding to the pattern of the first gate lines 102), and the spacer material 118 may extend up the sides of the hardmask 110, as shown. The first gate lines 102 may each be a first gate 162. Different ones of the first gate lines 102 may be electrically controlled in any desired combination (e.g., each first gate line 102 may be separately electrically controlled, or some or all the first gate lines 102 may be shorted together in one or more groups, as desired).

Multiple parallel second gate lines 104 may be disposed over and between the first gate lines 102. As illustrated in FIG. 1, the second gate lines 104 may be arranged perpendicular to the first gate lines 102. The second gate lines 104 may extend over the hardmask 110, and may include second gates 164 that extend down toward the quantum well stack 146 and contact the gate dielectric 114 between adjacent ones of the first gate lines 102, as illustrated in FIG. 1D. In some embodiments, the second gates 164 may fill the area between adjacent ones of the first gate lines 102/spacer material 118 structures; in other embodiments, an insulating material (not shown) may be present between the first gate lines 102/spacer material 118 structures and the proximate second gates 164. In some embodiments, spacer material 118 may be disposed on side faces of the second gate lines 104; in other embodiments, no spacer material 118 may be disposed on side faces of the second gate lines 104. In some embodiments, a hardmask 115 may be disposed above the second gate lines 104. Multiple ones of the second gates 164 of a second gate line 104 are electrically continuous (due to the shared conductive material of the second gate line 104 over the hardmask 110). Different ones of the second gate lines 104 may be electrically controlled in any desired combination (e.g., each second gate line 104 may be separately electrically controlled, or some or all the second gate lines 104 may be shorted together in one or more groups, as desired). Together, the first gate lines 102 and the second gate lines 104 may form a grid, as depicted in FIG. 1.

Multiple parallel third gate lines 106 may be disposed over and between the first gate lines 102 and the second gate lines 104. As illustrated in FIG. 1, the third gate lines 106 may be arranged diagonal to the first gate lines 102, and diagonal to the second gate lines 104. In particular, the third gate lines 106 may be arranged diagonally over the openings in the grid formed by the first gate lines 102 and the second gate lines 104. The third gate lines 106 may include third gates 166 that extend down to the gate dielectric 114 in the openings in the grid formed by the first gate lines 102 and the second gate lines 104; thus, each third gate 166 may be bordered by two different first gate lines 102 and two different second gate lines 104. In some embodiments, the third gates 166 may be bordered by insulating material 128; in other embodiments, the third gates 166 may fill the openings in the grid (e.g., contacting the spacer material 118 disposed on side faces of the adjacent first gate lines 102 and the second gate lines 104, not shown). Additional insulating material 117 may be disposed on and/or around the third gate lines 106. Multiple ones of the third gates 166 of a third gate line 106 are electrically continuous (due to the shared conductive material of the third gate line 106 over the first gate lines 102 and the second gate lines 104). Different ones of the third gate lines 106 may be electrically controlled in any desired combination (e.g., each third gate line 106 may be separately electrically controlled, or some or all the third gate lines 106 may be shorted together in one or more groups, as desired).

Although FIGS. 1A-F illustrate a particular number of first gate lines 102, second gate lines 104, and third gate lines 106, this is simply for illustrative purposes, and any number of first gate lines 102, second gate lines 104, and third gate lines 106 may be included in a quantum dot device 100. Other examples of arrangements of first gate lines 102, second gate lines 104, and third gate lines 106 are possible. Electrical interconnects (e.g., vias and conductive lines) may contact the first gate lines 102, second gate lines 104, and third gate lines 106 in any desired manner.

Not illustrated in FIG. 1 are accumulation regions that may be electrically coupled to the quantum well layer of the quantum well stack 146 (e.g., laterally proximate to the quantum well layer). The accumulation regions may be spaced apart from the gate lines by a thin layer of an intervening dielectric material. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the third gates 166 (e.g., by controlling the voltages on the quantum dot gates, the first gates 162, and the second gates 164) to form carrier-based quantum dots (e.g., electron or hole quantum dots, including a single charge carrier, multiple charge carriers, or no charge carriers). In other embodiments, a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein.

Apparatus and Method for a Hybrid Classical Quantum Computer

After Richard Feynman asked in 1982 whether quantum physics could be simulated efficiently using a quantum computer, much effort researching for a quantum computer has been focused on its universality and its efficiency over classical computation. One such example is David Deutsch's quantum Turing machine in 1985 that can be programmed to perform any computational task that can be performed by any physical object.

In contrast to theories and algorithms, quantum physical machines are in still their infancy. Efforts to build quantum information processing systems have resulted in modest success to date. Small quantum computers, capable of performing a small set of quantum operations on a very few qubits, represent the state of the art in quantum computation. In addition, quantum states are fragile in the sense that quantum states only remain coherent for a limited duration. This gap between algorithms and physical machines has driven the effort to invent hybrid classical-quantum algorithms. Some recent quantum algorithm developments have focused on short-depth quantum circuits to carry out quantum computations formed as subroutines embedded in a larger classical optimization loop, such as the variational eigensolver (P. J. J. O'Malley, 2016). Quantum languages, tools, and flows have been developed, providing software layers/stacks to translate and optimize applications to the quantum physical layer to cope with the stringent resource constraints in quantum computing (Frederic T. Chong, 2017, 14 Sep.).

On the hardware side, classical computers have been used to perform error correction for quantum computations. The "quantum co-processor" model is the most favorable prevailing execution model where a classical CPU controls a quantum processing unit in a similar manner to how CPUs in modern computer systems interact with GPUs. As described in (X. Fu, 2016, May) and (X. Fu, 2018), the microarchitecture for experimental superconducting quantum co-processors included features such as an arbiter on the code fetch data path to steer classical instruction to host CPU and quantum instruction to quantum co-processor, an exchange register file to synchronize register files between host CPU and the quantum co-processor, and a quantum instruction cache.

The microarchitectures for these mechanisms, however, are not well defined and explicit support for hybrid classical-quantum programs is lacking. Consequently, it is unclear how a quantum co-processor would be implemented within a quantum computer, particularly one which is required to run a diverse set of quantum programs. A flexible and programmable model has yet to be developed for executing hybrid classical-quantum algorithms.

One embodiment of the invention adds a set of quantum instructions to an instruction set architecture (ISA) of a processor such as a CPU. By way of example, these instructions may be included in an extension to the ISA (e.g., such as the AVX-512 extensions for the x86 platform). In addition, in one embodiment, a quantum engine is added to the processor's execution unit and the new quantum instructions are fetched, decoded, scheduled, and executed on the functional units of the quantum engine. In one embodiment, the quantum engine interacts with the classical execution engines using a shared register file and/or system memory. Upon executing the quantum instructions (or quantum uops in certain embodiments described herein), the quantum execution engine generates control signals to manipulate the state of the qubits within the quantum processor. The quantum engine also executes instructions to take a measurement of specified sets of qubits and store the results. In these embodiments, a quantum/classical interface provides connectivity between the quantum engine of the classical processor and the quantum processor.

Figure 2:
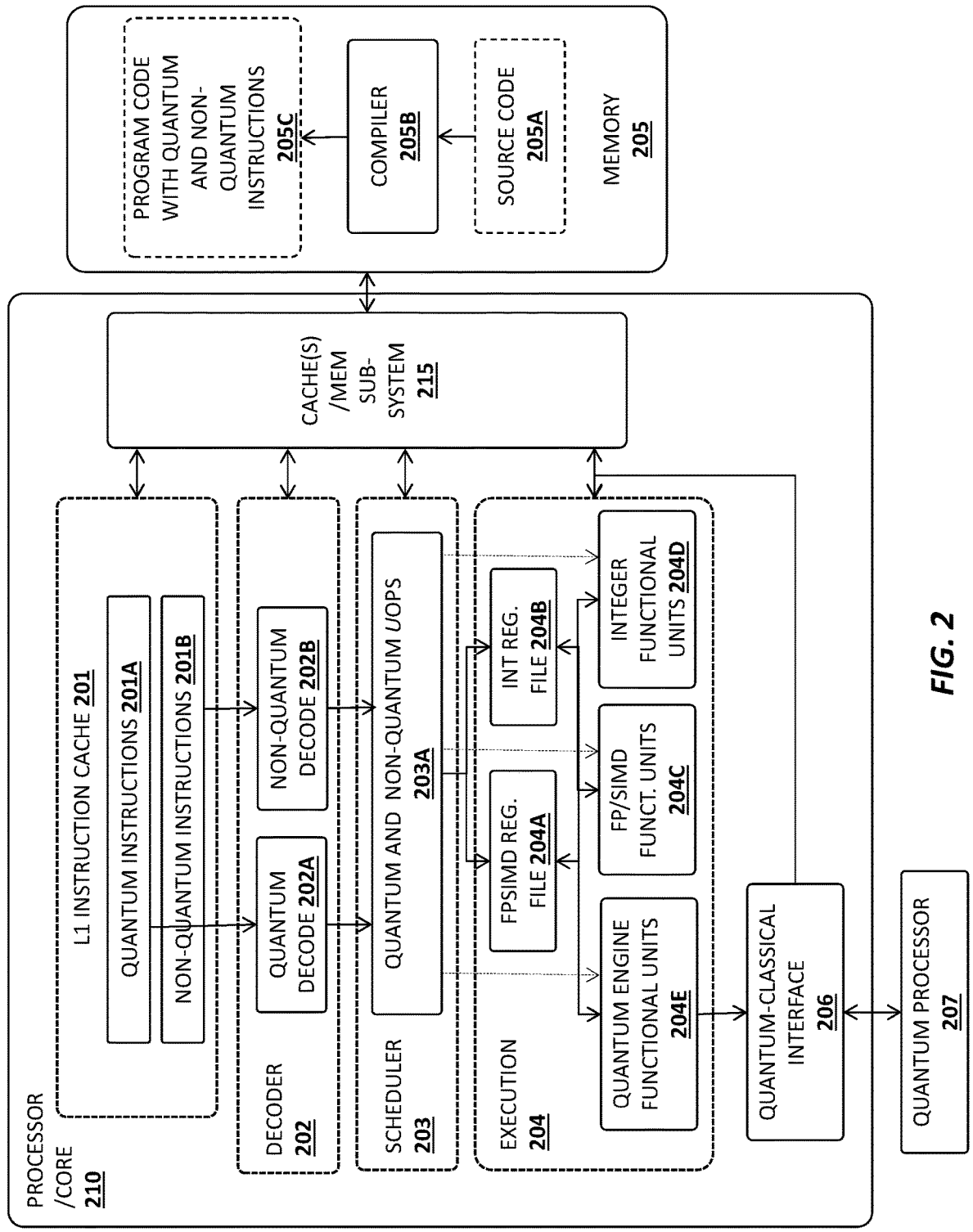
FIG. 2 illustrates one embodiment of a processor pipeline for processing quantum and non-quantum instructions.

FIG. 2 illustrates one embodiment of a processor or core 210 which fetches, decodes, and executes quantum instructions 201A and non-quantum instructions 201B, utilizing the same pipeline resources as the non-quantum instructions 201B. The processor/core 210 of this embodiment supports quantum extensions to an existing ISA of the processor/core 210 (e.g., extending the ISA to include the quantum instructions 201A). Program code 205C comprising the quantum and non-quantum instructions is generated by a compiler 205B from source code 205A written by a programmer (e.g., utilizing the extended ISA). Various source/program code examples are provided below.

Quantum and non-quantum instructions 201A-B are fetched from memory 205 at the front end of the instruction pipeline and stored in a Level 1 (L1) instruction cache 201. Instructions and data may also be stored within a Level 2 or Level 3 cache within a cache/memory subsystem 215, which manages memory requests and cache coherency.

A decoder 202 decodes the instructions 201A-B into micro-operations or uops 203A which are scheduled for execution by a scheduler 203 and executed by execution circuitry 204. In one embodiment, certain stages of the pipeline are enhanced to include hardware support for processing the quantum instructions 201B while other stages are unaltered. For example, quantum decode circuitry 202A may be added to the decoder 202 for decoding the quantum instructions 201A, just as non-quantum decode circuitry 202B decodes non-quantum instructions 201B. Although illustrated as separate components in FIG. 2 for the purpose of explanation, the quantum decode circuitry 202A and non-quantum decode circuitry 202B may comprise a common or overlapping set of circuitry and/or microcode. For example, in one embodiment, an existing decoder may be extended to include microcode support for quantum instructions (e.g., in microcode ROM) to generate new sets of quantum uops. The decoder 202 includes other decode circuitry such as a set of decode table structures (see, e.g., FIG. 3 and associated text), depending on the processor architecture.

In one embodiment, the decoder 202 generates a sequence of uops 203A in response to decoding the instructions 201A-B. In an implementation with quantum and non-quantum instructions, the uops may include a mixture of quantum uops and non-quantum uops, which are then scheduled for execution by an instruction scheduler 203.

The quantum and non-quantum uops 203A generated by the decoder 202 may initially be queued for execution within one or more uop queues of the scheduler 203, which dispatches the uops from the uop queue(s) in accordance with dependencies and/or execution resource availability. The embodiments of the invention may be implemented on various different types of processors with different types of schedulers. For example, in one embodiment, a set of execution "ports" couple the scheduler 203 to the execution circuitry 204, where each execution port is capable of issuing uops to a particular set of functional units 204C-E. In the example architecture shown in FIG. 2, for example, SIMD and floating point (FP) uops may be issued by the scheduler 203 over a FP/SIMD execution port coupled to a set of FP/SIMD functional units 204C and integer cops may be issued over an integer port coupled to a set of integer functional units 204D. While only two types of non-quantum functional units are shown for simplicity, the processor/core 210 may include various other/additional non-quantum functional units (e.g., such as load/store address generation units, branch units, additional SIMD and integer units, etc).

In the particular embodiment shown in FIG. 2, the quantum engine functional units 204E share the same set of register files 204A-B used by the legacy processor functional units 204C-D. In this particular example, the register files 204A-B include a FP/SIMD register file 204A which stores floating point and SIMD operands used by the FP/SIMD functional units 204C and an integer register file 204B which stores integer operands for the integer functional units 204D. In one implementation, the FP/SIMD register file 204A comprises 512 bit vector registers and the integer register file 204B comprises 64-bit scalar registers. Of course, different processor architectures will use different types of registers shared by the quantum engine functional units 204E. Various other types of registers may also be used such as a set of control/status registers and mask registers.

In an embodiment in which quantum uops are mixed with non-quantum uops, the quantum uops are issued over one or more quantum ports to a set of quantum engine functional units 204E, which execute the quantum uops to perform the underlying quantum operations. For example, the quantum engine functional units 204E, in response to the quantum uops, may generate control signals over a quantum-classical interface 206 to manipulate and take measurements of the qubits of a quantum processor 207.

The quantum-classical interface 206 includes digital-to-analog (D-A) circuitry to convert the digital quantum control signals generated by the quantum engine functional units 204E to analog signals required to control the quantum processor 207 (e.g., such as the codeword triggered pulse generation (CTPG) units and Arbitrary Waveform Generator (AWG) described below) and also includes analog-to-digital (A-D) circuitry to convert the physical qubit measurements to digital result data.

In one embodiment, the quantum-classical interface 206 is integrated on the same semiconductor chip as the other components of the instruction processing pipeline (e.g., the execution circuitry 204, scheduler 203, decoder 202, etc). As discussed in detail below, different types of circuit/logic components may be used depending on the particular physical implementation of the quantum processor 207.

Figure 3:
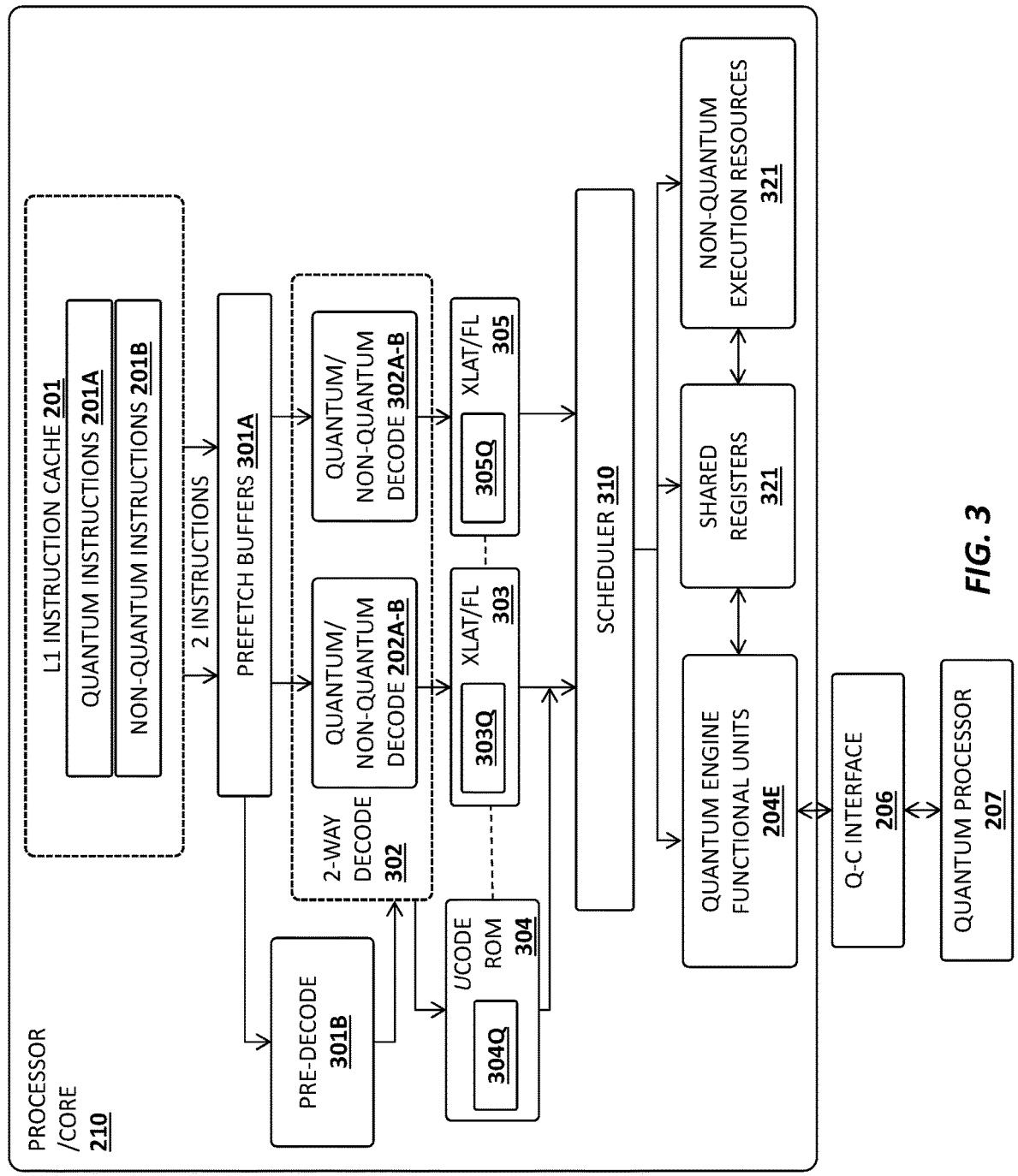
FIG. 3 illustrates an embodiment of front-end circuitry of a processor for processing quantum and non-quantum instructions.

FIG. 3 illustrates one embodiment in which quantum instruction processing support is added to a low power processing pipeline including a pre-decode buffer 301B, a 2-way decoder 302 with dual sets of quantum/non-quantum decoder circuitry 202A-B, 302A-B, dual lookup tables for instruction translation (XLAT), and a ucode ROM 304. In one embodiment, the XLAT components 303, 305 and ucode ROM 304 are extended to support the quantum instructions, as indicated by logic blocks 303Q-305Q. The pre-decode buffer 301B detects and marks macroinstruction boundaries prior to full decoding into uops by the 2-way decoder 302.

The operands for the quantum and non-quantum uops are stored in a set of shared registers 321 (as described above) and accessed by the quantum functional units 320 when executing the uops. The Q-C interface 320, in response to the quantum uops, controls the operation of the quantum processor 207.

Figure 4A:
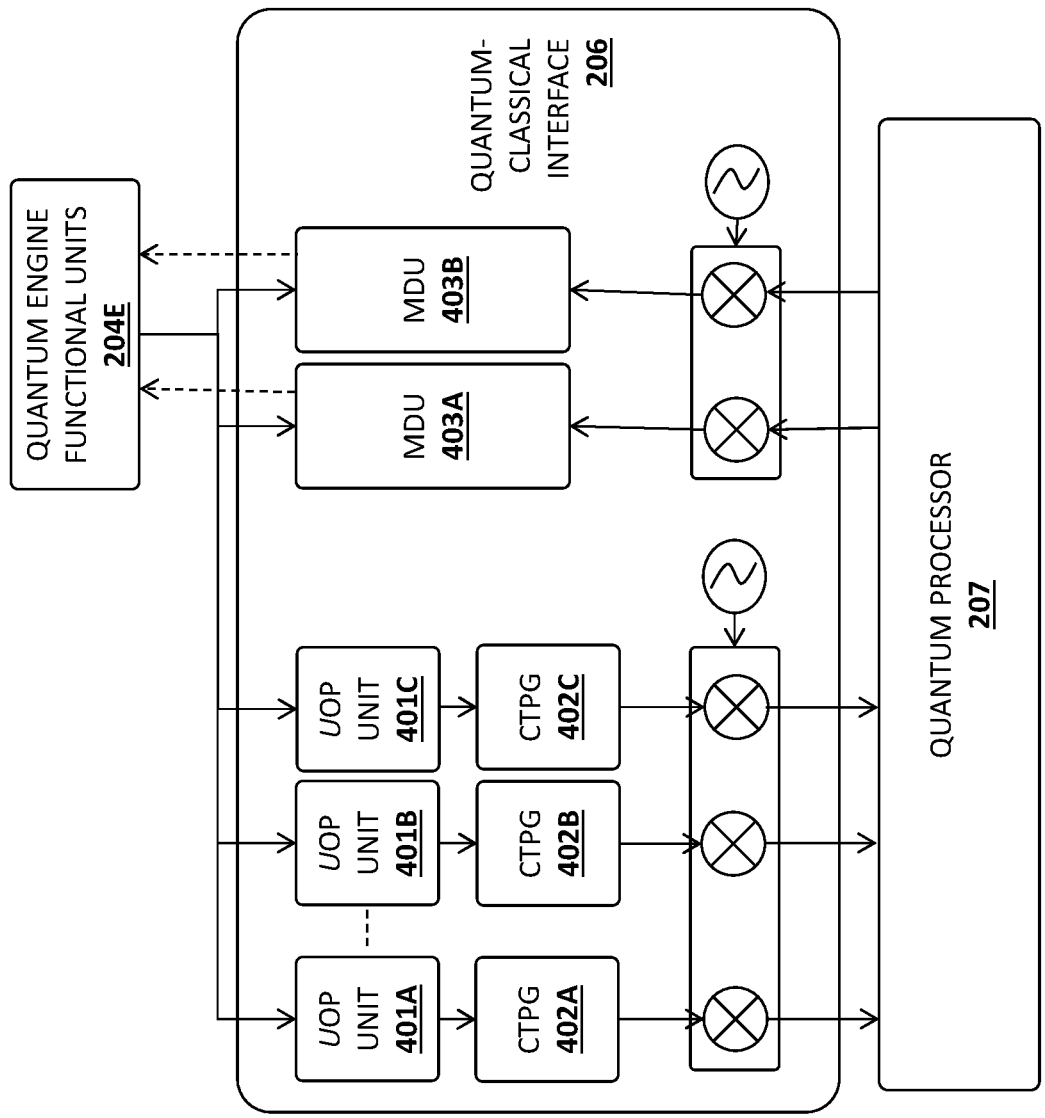
FIGS. 4A-B illustrate embodiments of a quantum-classical processor interface.
Figure 4B:
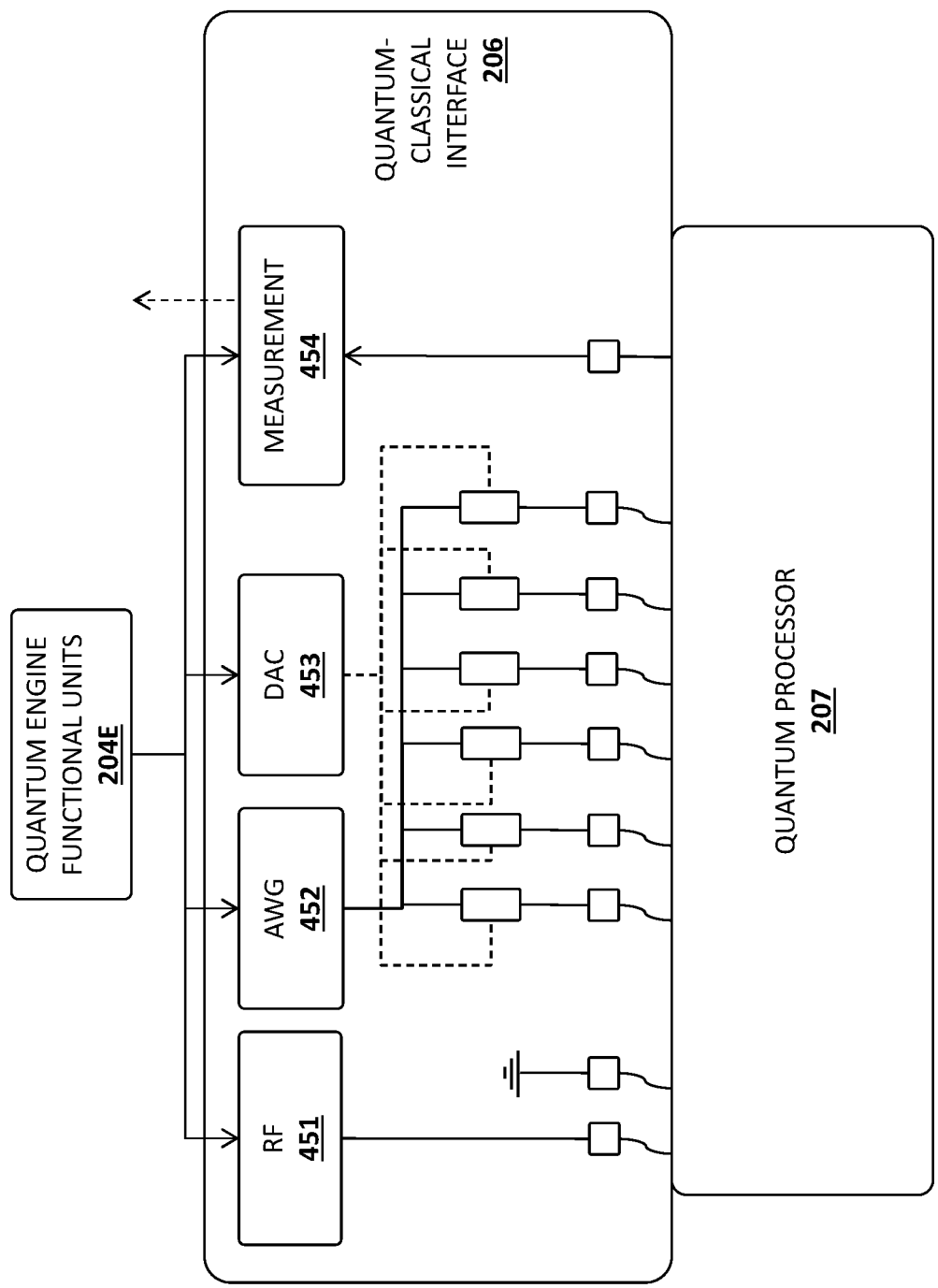

Different examples of a quantum-classical interface 206 are illustrated in FIGS. 4A-B. The Q-C interface 206 in FIG. 4A includes a plurality of uop units 401A-C which, responsive to the uops executed by the quantum engine functional units 204E, generate codewords to control operation of a plurality of codeword triggered pulse generation (CTPG) units 402A-C. In response, the CTPG units 402A-C generate sequences of pulses to control the qubits of the quantum processor 207. Once the quantum processor 207 has reached a specified execution state, quantum measurements are taken by one or more of the measurement discrimination units (MDUs) 403A-B.

The Q-C interface 206 shown in FIG. 4B includes a set of components to perform microwave complex signal generation including an RF microwave unit 451, multi-channel Arbitrary Waveform Generators (AWG) 452, one or more digital to analog converters (DACs) 453 and one or more measurement units 454. In one embodiment, the input to each of these components comprises a set of codewords generated by the quantum engine functional units 204E and the output is an analog waveform which manipulates the state of the qubits of the quantum processor 207. The measurement units 454 measure a current state associated with one or more qubits at a designated point in execution.

Figure 5A:
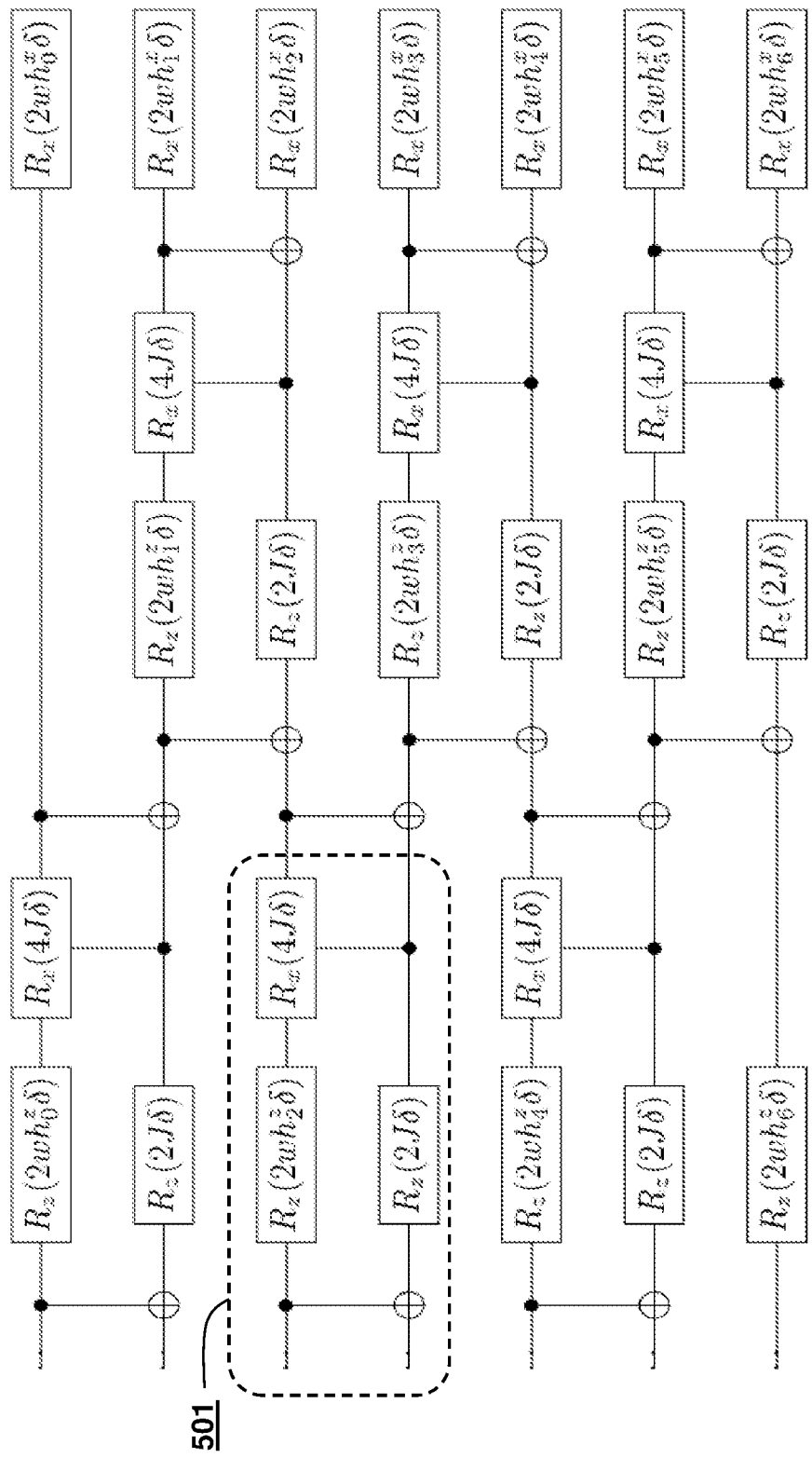

To further guide the analysis and discussion, a concrete example is illustrated in FIG. 5A, which shows a quantum circuit for a many-body disordered Hamiltonian to be time-evolved. Note that the angle through which $R_x$ and $R_y$ rotate are derived from several parameters. Particularly, $h_k^z$ and $h_k^x$ with k∈{0, 1, . . . , 5, 6} are randomly generated and are used to emulate large many-body systems that require many more number of qubits than what the underlying quantum chip supports.

One example of a quantum program that uses this circuit for a portion of its computation is illustrated in FIG. 5B which includes a mixture of quantum instructions and non-quantum instructions (as indicated by the comments to the right of the source code). In this example, NR is the number of disorder realizations (i.e. multiple small random realizations to emulate a large many-body system), NQ is the number of Qubits, NP is the number of iterations in order to achieve the required precision on Probability (Pr), NT is the number of Trotter steps, and a[i] accumulates Qubit measurement. The probability of qubits being in state |0> or |1> is obtained by repeating measurements (NP) and averaging.

This program structure shows how classical operations and quantum operations may be tightly intertwined and executed on the classical-quantum processing architectures described herein. The most efficient way to execute this program is to process all instructions in a pipeline such as those described above, with the quantum engine functional units 204E for controlling qubits configured as execution engine peer to other classical execution engines 204A-B (such as integer, floating point, etc.).

Figure 6A:
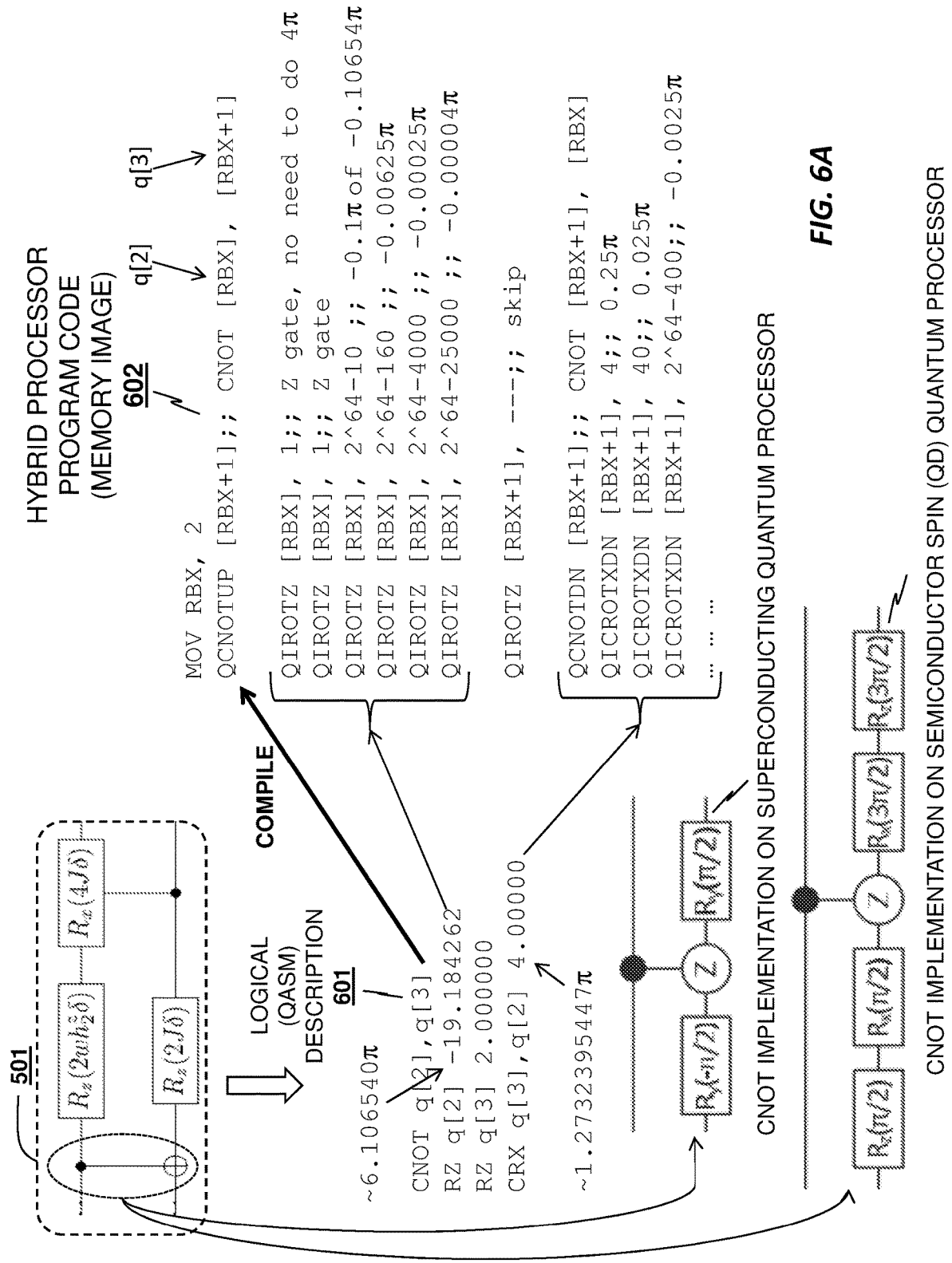
FIGS. 6A-B illustrate an example in which quantum instructions are generated by a compiler, decoded into uops, and executed within a quantum execution engine.
Figure 6B:
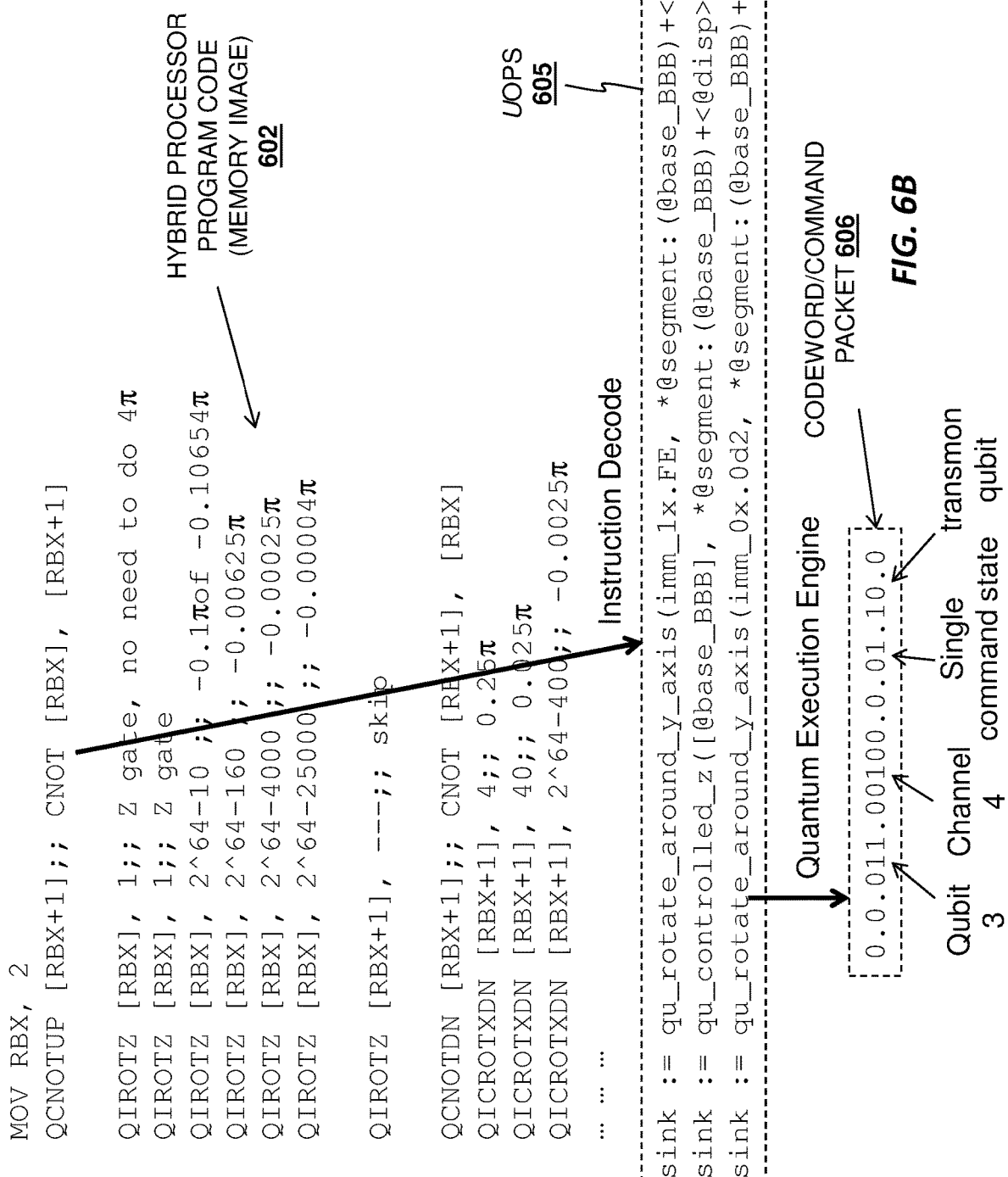

FIGS. 6A-B provide an example of the quantum operations performed in response to the program code in FIG. 5A. In particular, FIG. 6A illustrates a portion of quantum assembly language (QASM) code 601 to implement the highlighted portion 501 of the quantum circuit in FIG. 5A. The QASM code 601 is compiled into hybrid processor program code 602 in memory 205. In this example, the registers RBX and RBX+1 from the shared register file 321 or 204B are used to hold qubit indices to address logical qubits #2 and #3, respectively, in this particular example. The mapping of the relevant portions of the QASM code 601 to the hybrid processor program code 602 is indicated by arrows.

FIG. 6B illustrates how a quantum macroinstruction QCNOTUP (to implement a CNOT gate) is decoded into a series of uops 605 by the decoder 202. The uops 605 are executed by the quantum engine functional units 204E to generate codewords with a specified codeword or command packet format 606. In one particular format, a first data field indicates the qubit on which the operation is to be performed (qubit 3 in the example), a second data field indicates the channel over which the operation is to be transmitted (channel 4), a third field to indicate the command state (e.g., single command state), and a fourth data field to indicate the type of qubit (a transmon qubit). Of course, the underlying principles of the invention are not limited to any particular encoding format.

Figure 7:
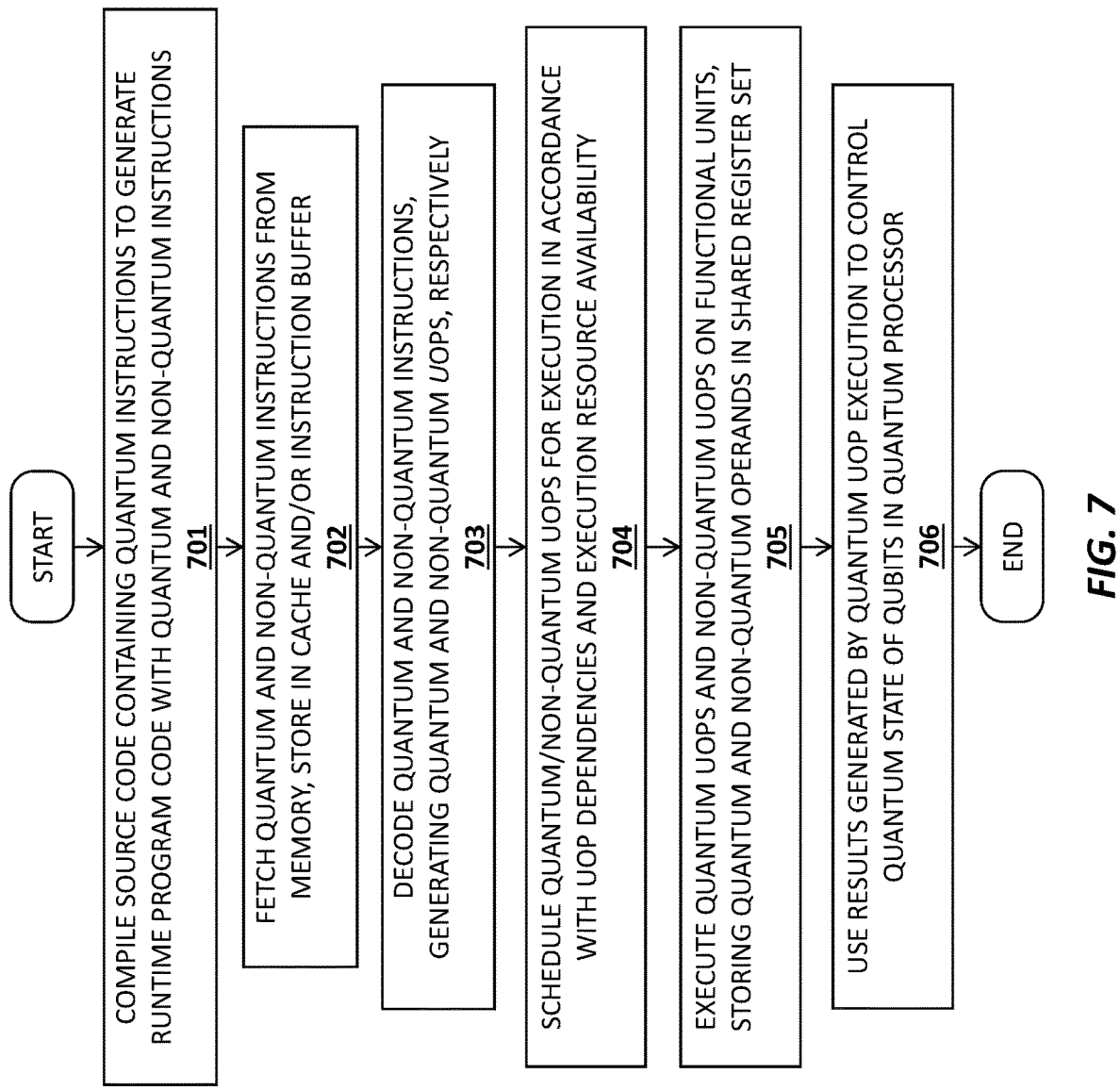
FIG. 7 illustrates a method in accordance with one embodiment of the invention.

A method in accordance with one embodiment of the invention is illustrated in FIG. 7. The method may be implemented within the context of the processor architectures described above but is not limited to any particular processor or system architecture.

At 701 source code containing quantum instructions is compiled to generate runtime program code with quantum and non-quantum instructions. At 702 the quantum/non-quantum instructions are fetched from memory and stored in a local cache (e.g., the L1 instruction cache) or instruction buffer. As mentioned, quantum instructions may be freely mixed with non-quantum instructions within the pipeline.

At 703 the quantum and non-quantum instructions are decoded into sets of quantum and non-quantum uops, respectively, and stored in a queue prior to execution. At 704 the quantum/non-quantum uops are scheduled for execution based on uop and/or resource dependencies. For example, if a first uop is dependent on the results of a second uop then the first uop may be scheduled for execution only when the data produced by the second uop is available in one of the registers. Similarly, if a particular functional unit is busy, then the scheduler may wait for an indication that the functional unit is available before scheduling a uop which requires that functional unit. Various other/additional scheduling techniques may be implemented (e.g., scheduling based on priority, register load, etc).

At 705 the quantum uops and non-quantum uops are executed on their respective functional units within the execution circuitry. As mentioned, the shared register set may be used to store the source and destination operands required by these uops.

At 706, the results generated by the execution of the quantum uops may be used as input to an interface unit to control the quantum state of the qubits in a quantum processor. In one embodiment, a series of codewords or command packets may be generated which identify a quantum channel, one or more qubits within a quantum processor, a qubit type and/or a command state. The specific physical operations performed in response to the codeword or command packet is based on the underlying type of quantum processor used.

The embodiments described herein integrates quantum instructions within an existing processor pipeline. Because of the tight integration, these embodiments significantly reduces the various overheads/bottlenecks associated with current co-processor designs. These overheads/bottlenecks include, for example, the communication between the classical computation layers/modules and the quantum computation layers/modules in the software stack and between the classical CPU and the quantum chip via the message queue. Given the relatively small size of quantum routines, the current GPU-like co-processor implementations are inefficient.

Due to increased classical processing capabilities, hybrid co-processor models reduce some of the overhead. In one particular implementation which supports the hybrid co-processor model, many new micro-architecture mechanisms were introduced. However, these micro-architectural mechanisms were ambiguously defined as was the boundary between the classical CPU and quantum co-processor.

In contrast, in the hybrid architecture described herein, the classical computation pipeline is equipped to fully support a defined set of quantum instructions which may be freely mixed with non-quantum instructions both at the front end of the pipeline (i.e., at the macroinstruction level) and within the back-end of the pipeline (e.g., where quantum uops are mixed with non-quantum uops) and executed on functional units within the execution circuitry of the processor.

Scalable Qubit Addressing Mode for Quantum Execution Engine and/or Co-Processor

In quantum computing, a qubit is a unit of quantum information which is the quantum analogue of a classical binary bit. The computation is achieved by applying quantum gates, representing quantum logical operations, directly to qubits. Mathematically, this computing process is described as qubits undergo unitary transformations. Upon completion of computation, qubits are measured to gain information about the qubit states.

Therefore, to describe a quantum operation, it is necessary to identify the qubit or set of qubits to which the operation is applied. In a quantum program, each quantum instruction needs to encode both an operation to be performed and one or more qubits on which to perform the operation. In existing quantum instruction set architectures (e.g., QASM, Open QASM, QIS, etc) register operands are normally encoded in the opcode of an instruction. This scheme works for classical computing because the number of registers are very limited (e.g., 16, 32, 64, etc). However, this scheme is not scalable for quantum computing as quantum instructions will ultimately need to address a very large numbers of qubits. Consequently, encoding qubit addresses in the opcode field of quantum instructions would explode the instruction width.

As described above, in one embodiment, quantum instructions and non-quantum instructions are processed together within a shared processor pipeline. As such, the quantum instructions may rely on the same addressing modes as those available to the non-quantum instructions. The qubits in this embodiment are therefore addressed in a similar manner as non-quantum instructions which access system memory, providing a sufficiently large address space to accommodate a large number of qubits.

Figure 8:
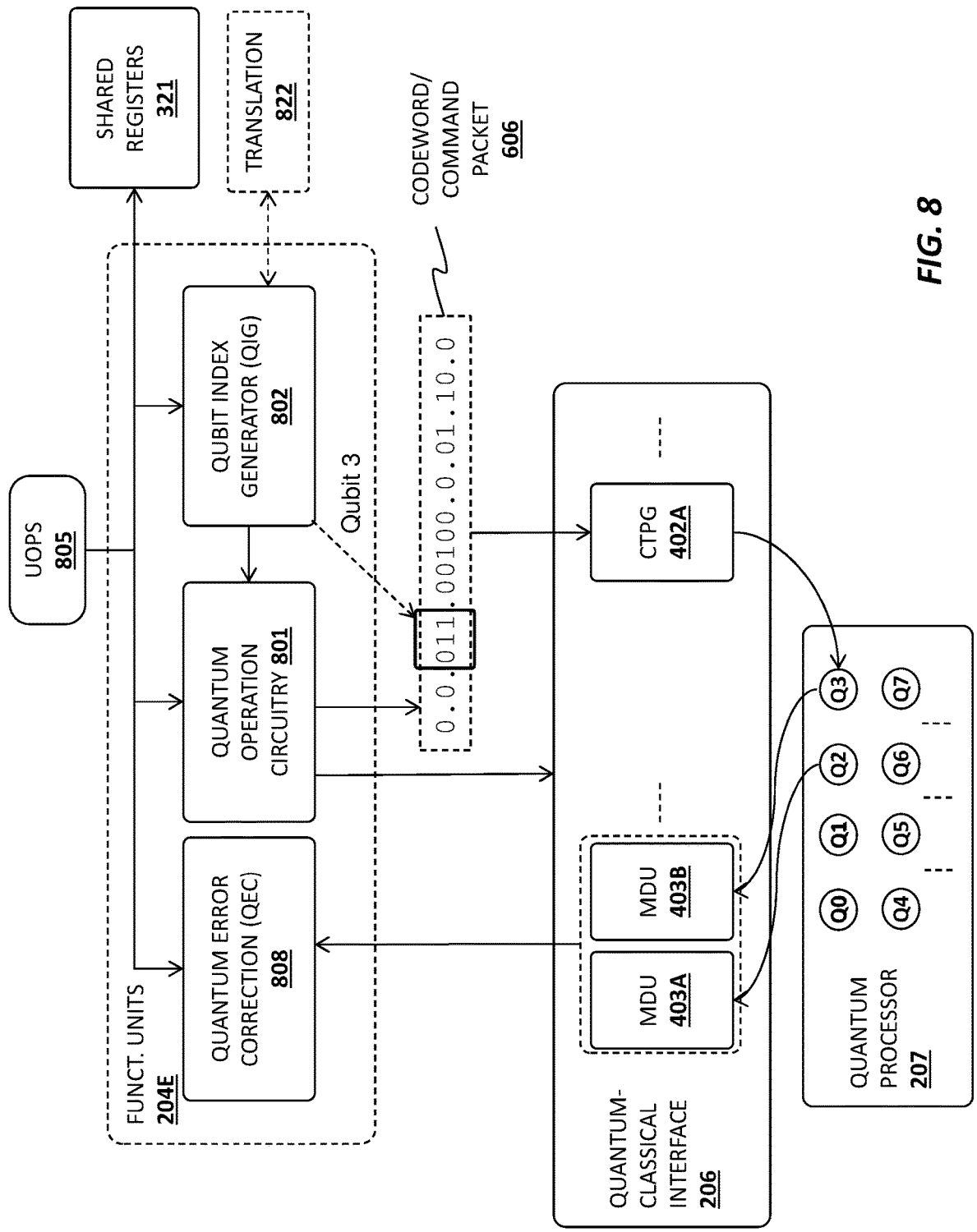
FIG. 8 illustrates one embodiment of a qubit index generator for addressing qubits within a quantum processor.

As illustrated in FIG. 8, in this embodiment, the quantum engine functional units 204E include a qubit index generation unit (QIG) 802 which determines a qubit index value or qubit ID in response to one or more uops 805. One or more quantum operation units 801 process the operations specified by the uops. The qubit index value (e.g., 011 for qubit 3 in the example) is then incorporated within the codeword/command packet 606, potentially along with one or more commands generated by the quantum operation unit 801 in response to processing the uops 805.

The QIG 802 may operate in accordance with different addressing modes supported by the processor. In one embodiment, the instruction identifies one of the shared registers 321 which contains the qubit index value (sometimes also referred to as a qubit ID). It may then use the qubit index value to identify the qubit within the codeword/command packet 606 and/or perform an operation using the qubit index value to generate one or more additional qubit index values. For example, it may add the qubit ID value to an integer specified by the uop to generate a second qubit ID.

The following examples demonstrate one way in which the QIG 802 generates qubit IDs in response to uops using an x86 assembly syntax. These operations may be performed within an x86 pipeline extended to support quantum instructions. However, the same general principles may be implemented on any processor architecture.

The single qubit instruction "QIROTX [RDI], 1" applies an X gate to the qubit number stored in RDI. Thus, if RDI contains 5, the X gate is applied to qubit number 5. In this example, the QIG 802 determines the qubit ID simply by reading the value stored in RDI (which is one of the shared registers 321 in this example). In this embodiment, the RDI value was stored previously by another uop. As another example, if the architecture register RBX contains a value of 2, then the two qubit instruction "QCNOTUP [RBX+3]," applies a CNOT operation with qubit 2 (q[2]) being the control qubit and qubit 5 (q[5]) being the target qubit. The QIG interprets the [RBX+3] notation as: the ID of the control qubit is stored in RBX and the ID of the control qubit+3 is the target qubit ID. Thus, the addressing scheme is extended so that two different qubits can be addressed with a single instruction, (i.e., CNOT). In contrast, in classical computing, only one memory location is addressed per instruction.

FIG. 8 also illustrates a codeword triggered pulse generator (CTPG) 402A which includes control logic and an analog-to-digital converter for interpreting the codeword/command packet 606 to identify one or more qubits (Q3 in the example) and generate a sequence of pulses to implement the specified quantum operations. When all of the quantum operations have been performed, as specified by the program code 205C, the quantum operation circuitry 801 and QIG 802 generates a codeword/command packet 606, causing one or more MDUs 403A-B to take a measurement of one or more qubits (as specified by the QIG 802 which generates the qubits indices). As mentioned, the MDUs include analog-to-digital circuitry to convert the analog measurements to digital values, which are then processed by a quantum error correction unit 808 to detect and potentially correct errors. If valid result data has been received it may be stored within one or more of the shared registers 321 and/or accumulated with prior measurement data. In addition to error correction, the measurement can also be used for program flow control based on measurement feedback.

The quantum error correction unit 808 may implement various techniques for detecting and correcting quantum errors. For example, in one embodiment, an error decoder (within the QEC unit 808) decodes a multi-qubit measurement from the quantum processor 207 to determine whether an error has occurred and, if so, implements corrective measures (is possible). The error measurements may be taken from multiple qubits in a manner which does not disturb the quantum information in the encoded state of the qubits (e.g., using ancilla qubits). In response, the QEC unit 808 generates error syndrome data from which it may identify the errors that have occurred and implement corrective operations. In one embodiment, the error syndrome data comprises a stabilizer code such as a surface code. In some cases, the response may simply be to reinitialize the qbits and start over. In other cases, however, modifications to the quantum algorithm implemented in the quantum program code 205C can be made to stabilize the region of the quantum processor responsible for the error (e.g., where compiler 205B includes a just-in-time (JIT) compiler). In either case, the CTPGs 402A perform the underlying physical operations under the control of the codewords/command packets 606 generated by the QEFU 204E. For example, the CTPG 402A may generate electromagnetic pulses to adjust the phase of one or more qbits in accordance with the detected phase error, or to reset the phase/spin of all qbits if re-initialization is required.

Addressing qubits in a manner which is similar to how classical CPU's address memory provides the scalability characteristics/attributes required for future quantum processor implementations. In particular, the above-described embodiments provide qubit indexing which is seamlessly integrated within an existing processor ISA and scales to a large number of qubit systems. These embodiments also remove pressure from the quantum instruction opcode space by way of a quantum extension to x86 or other architectures to address the qubit space and integrate quantum operations to existing processor pipelines.

Figure 9:
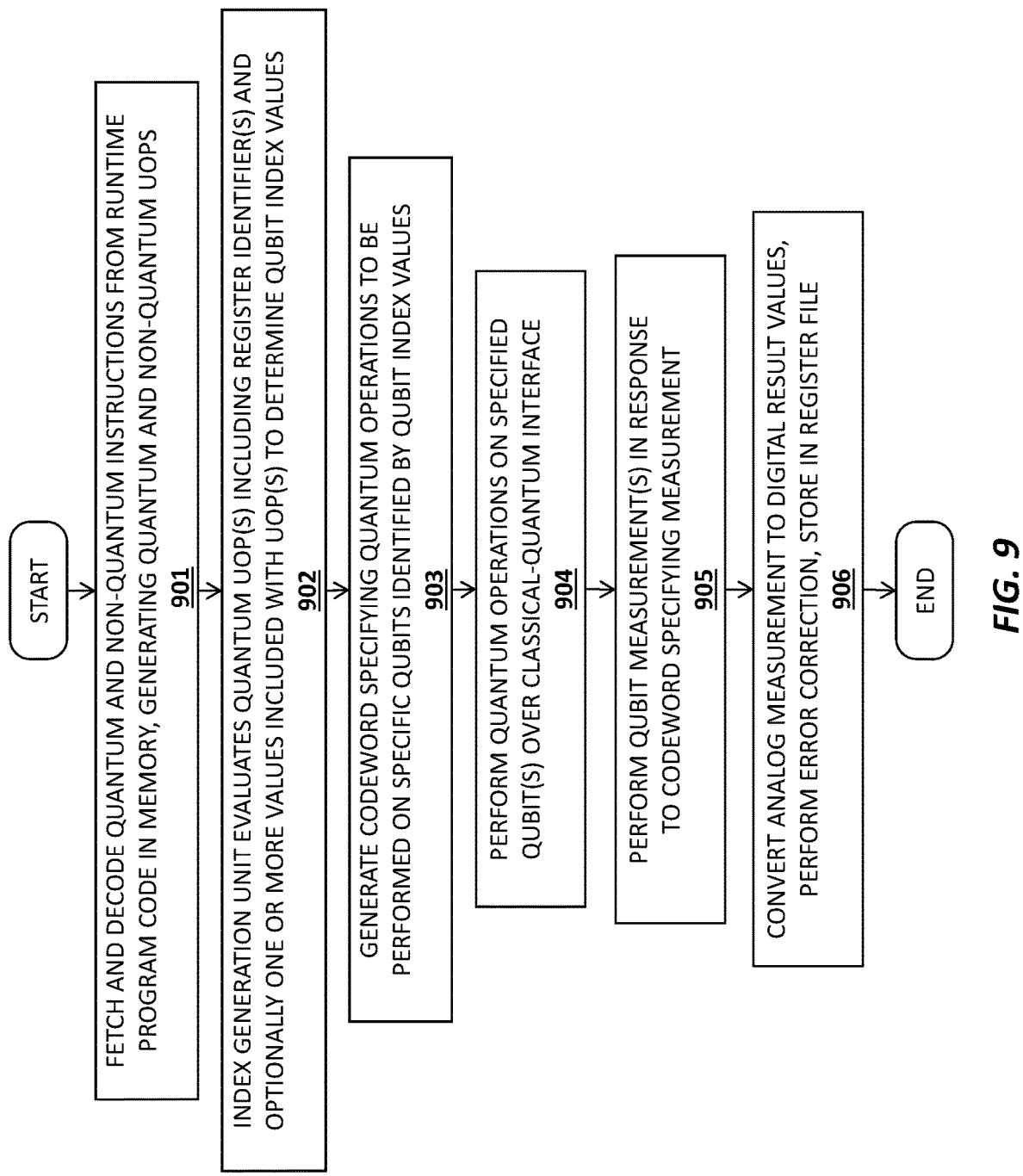
FIG. 9 illustrates a method for determining qubit index values for identifying qubits.

A method in accordance with one embodiment of the invention is illustrated in FIG. 9. The method may be implemented on the architectures described above but is not limited to any particular processor or system architecture.

At 901 quantum and non-quantum instructions from run-time program code are fetched and decoded, generating quantum and non-quantum uops. At 902 an index generation unit evaluates quantum uops including register identifiers and optionally one or more values included with the uops to determine qubit index values. As described above, the indices may be generated using a variety of techniques including reading qubit index values from registers identified by the uops and generating additional qubit index values using integer values included with the uops.

At 902, the quantum execution circuitry generates a codeword specifying the quantum operations to be performed on the qubits identified by the calculated qubit index values. At 905, qubit measurements are performed in response to another codeword generated based on additional uops. At 906, the analog measurement made on one or more of the qubits are converted to digital values. Error correction and/or flow control may then be performed based on the resulted digital result values stored in a register file of the processor.

Apparatus and Method for Automatic Real-Time Calibration of Qubit Chips

One of the primary challenges in quantum computer design is ensuring that the error rate is maintained beneath an acceptable threshold. The ideal control strategy for each individual quantum gate depends on the characteristics of the underlying type of error and designs have been proposed which uniquely tailor control strategies to each type of error through a calibration process.

Qubit calibration is currently performed manually, prior to execution. This is a problem because many algorithms take a long time to run which means that the original calibration may no longer be applicable. As a result, the fidelity of the qubit gates can degrade to a point where the full algorithm cannot be implemented. Thus, there is a need to calibrate the control parameters during execution of the algorithm to offset the effects of noise.

Real-time, ancilla qubit-based calibration has been proposed for trapped-ion qubits. However, the proposed framework only considers coherent errors in the system and does not provide a fast control algorithm for calibration.

In addition, quantum systems have been proposed which implement machine-learning techniques for closed loop quantum control. However, these machine-learning methods require measurements of the quantum system and cannot be deployed during execution of the quantum algorithm. Moreover, current open-loop control proposals do not consider real-time environmental-induced errors in the quantum system.

One embodiment of the invention implements machine-learning techniques to learn and calibrate qubit control parameters in real-time, during system operation (e.g., during execution of the underlying quantum algorithm). In particular, a classical or quantum model is used to simulate the dynamics of the system, enabling the machine-learning engine to predict the new control parameters.

Noisy measurements from sensors close to the data qubits are provided as input to the machine-learning engine, which learns how these sensor values are related to the control parameters. The machine-learning engine can then use the learned correlation to predict new control parameters (e.g., new/adjusted DC pulses) to compensate for real-time changes in the system. For example, the new control parameters may be implemented in barrier and plunger gate voltages. In an implementation where a simulated model is used, the model validates whether the new control parameters are reasonable.

Figure 10A:
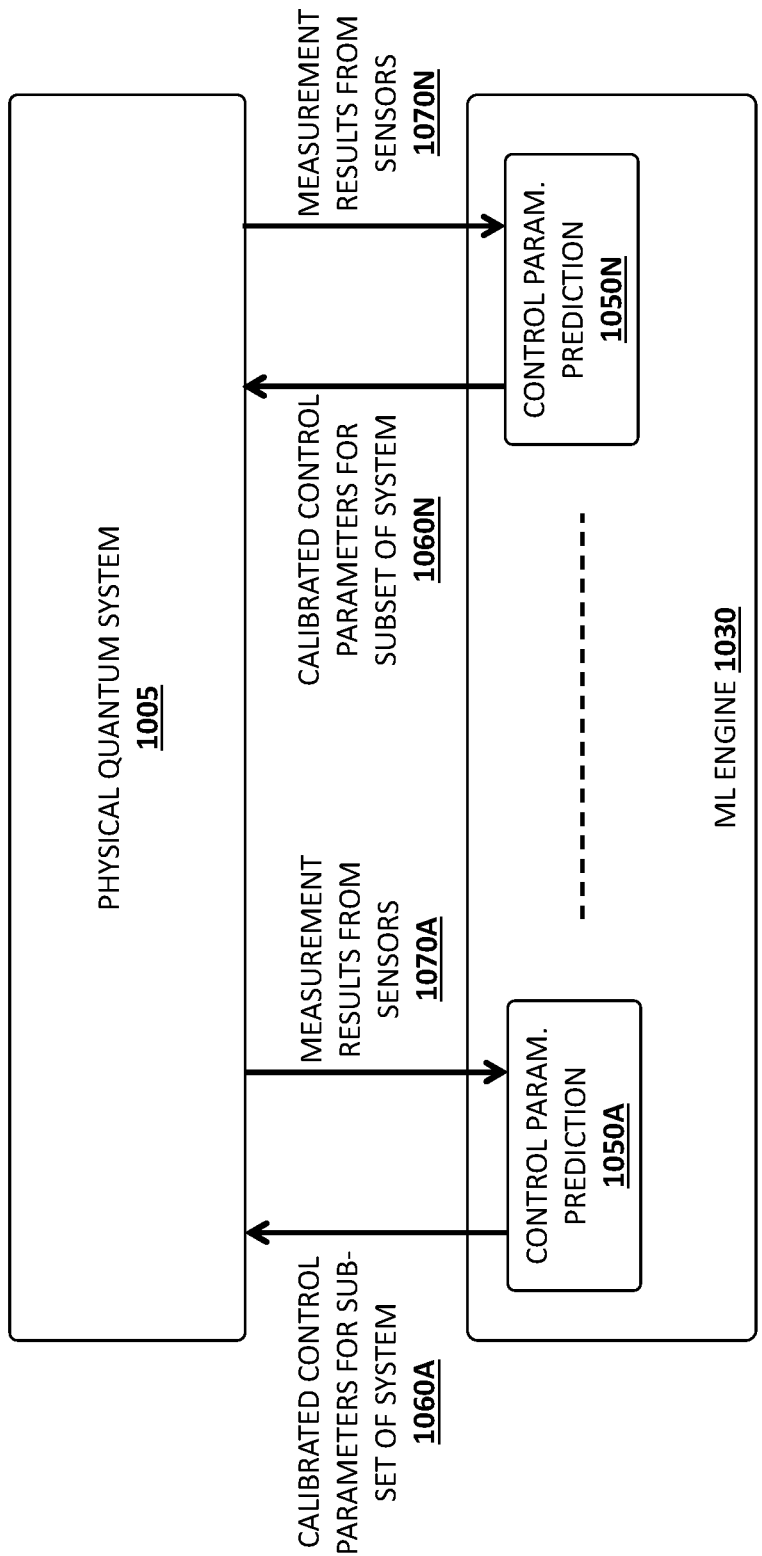
FIGS. 10A-B illustrate embodiments of an architecture for real time qubit calibration using machine-learning.

FIG. 10A illustrates one embodiment of a machine-learning architecture in which a machine learning engine 1030 renders a plurality of control parameter predictions 1050A-N based on feedback from a physical quantum system 1005. In particular, each instance of the control parameter prediction logic 1050A-N executed by the ML engine 1030 evaluates measurement results from sensors 1070A-N for a subset of the quantum system (e.g., a single qubit or small number of qubits) and compares the measured results with estimates to determine a difference value. It then predicts a set of control parameters 1060A-N to control the qubits within its portion of the system. One embodiment of the invention continues to operate in this manner—with the ML engine 1030 receiving measurement feedback 1070A-N from relevant sensors and the control parameter prediction instances 1050A-N rendering new control parameter predictions 1060A-N.

Figure 10B:
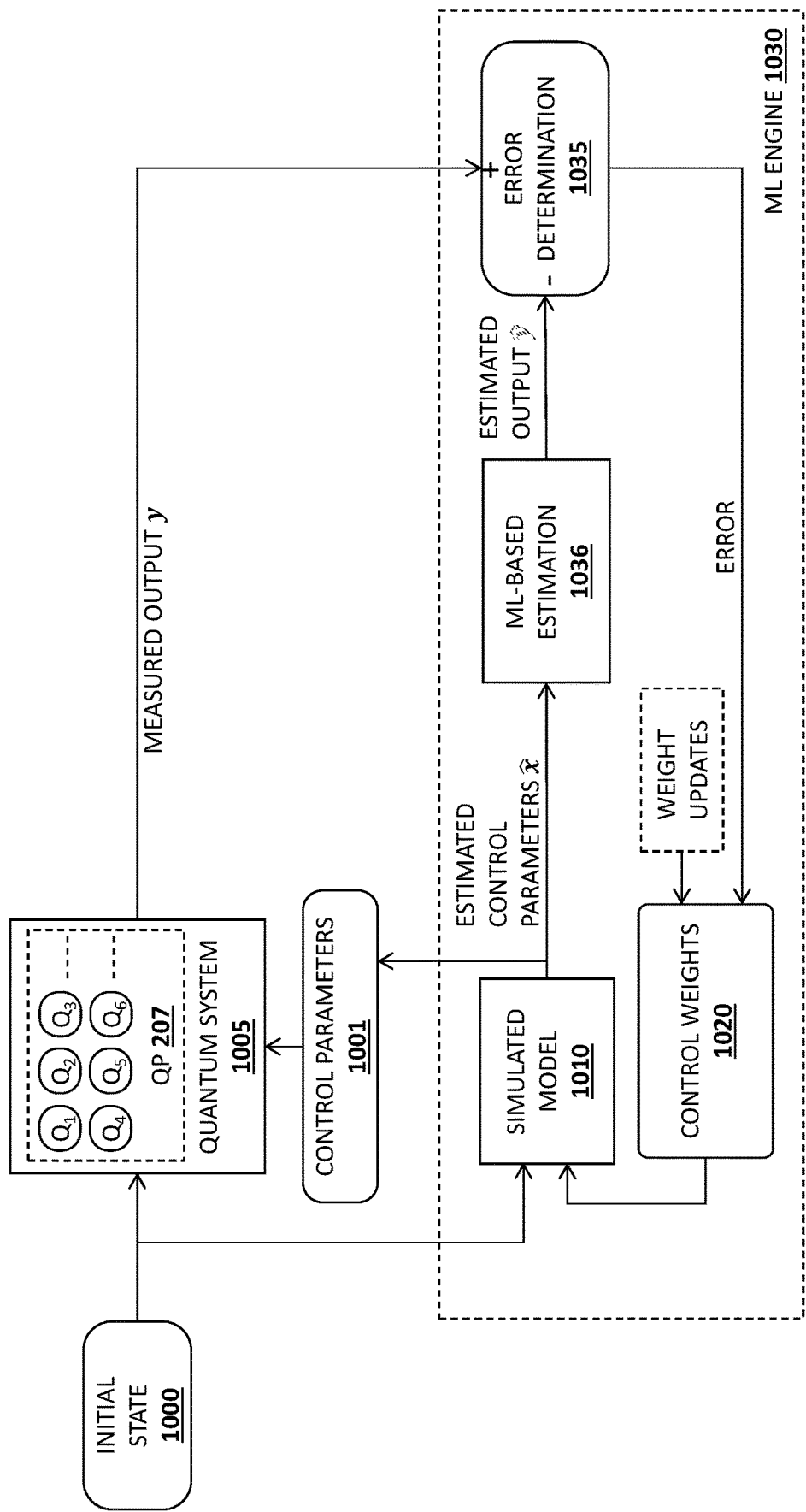

FIG. 10B illustrates one embodiment of an architecture for performing real-time calibration of a quantum system. The physical quantum computing system 1005 of this embodiment may be implemented using any of the different quantum processors and quantum control architectures described herein (e.g., quantum processor 207, CPTG units 402A-B, MDUs 403A-B, etc). It should be noted, however, that the underlying principles of the invention are not limited to these specific implementations. In one embodiment, the quantum processor 207 comprises a quantum-dot processor; however, the underlying principles of the invention are not limited to quantum-dot processors.

In one embodiment, the physical quantum system 1005 includes a quantum processor 207 comprising a plurality of qubits $Q_1$-$Q_6$ configured in an initial state 1000 via a sequence of RF control pulses (e.g., via CTPG units 402A-C). Once in the initial state 1000, the qubits $Q_1$-$Q_6$ of the quantum system 1005 may be manipulated via additional sequences of RF pulses, DC pulses, or a combination thereof control pulses in accordance with specified control parameters 1001 to implement a quantum algorithm.

When applying control pulses to the data qubits to perform quantum gates, spatially neighboring qubits can be affected due to unwanted couplings and environmental noise. To address this problem, one embodiment of the invention includes a machine learning engine 1030 to optimize and calibrate the control parameters 1001 in real time. In particular, the measured output (y) is collected from the sensors on the quantum processor chip such that the states of the data qubits are preserved. For example, measurement discrimination units (MDUs) may determine the state of ancilla qubits, which can be used to determine the state of corresponding data qubits in the quantum processor 207.

A set of sensors in local proximity of the data qubits are considered for measurement without disturbing the data qubits. By assigning some sensors in proximity with data qubits, the machine-learning engine 1030 can determine a correlation between the control parameters 1001 applied on the data qubits and the measured output (y) from the sensors. As shown in FIG. 10, using this learned model, we can estimate the measurements outputs given the estimated control parameters.

A mathematical/simulated model 1010 is used which performs the time-evolution of the system (e.g., capturing the dynamics of the quantum system 1005). For example, the simulated model 1010 may be implemented in program code executed on a classical computing system. Simulated model 1010 generates estimated control parameters $\hat{x}$, which are used as input to a machine-learning (ML)-based estimator 1036 which generates an estimated output $\hat{y}$ of the quantum system 1005. An error determination module 1035 then determines the difference between the estimated output $\hat{y}$ and the measured output y.

Using the simulated model 1010 and considering the error covariance between the actual measurements y from the sensors and the estimated measurements outputs $\hat{y}$ from the ML-based estimator 1030, new control parameters 1001 are predicted to minimize the cost function (i.e. maximize process fidelity). In one embodiment, a set of control weights 1020 associated with the measured outputs y and estimated outputs $\hat{y}$ are determined and applied as input to the simulated model 1010. Initially, more weight may be applied to the measured outputs y than the estimated outputs $\hat{y}$ (i.e., because the ML engine 1030 has not performed sufficient learning). After learning, greater weight may be applied to the estimated outputs $\hat{y}$. However, this is just one example; weights may be adjusted in various ways while still complying with the underlying principles of the invention.

By way of example, and not limitation, a Markovian-based recursive learning algorithm may be used to calibrate the control parameters in real time. The control algorithm performs the prediction and update phases such that at each phase, only the result of the previous phase is required.

Therefore, the algorithm is fast and does not consume a large memory to store previous measurements results or control parameters. The steps of the algorithm are as follows:

One embodiment of the machine-learning engine 1030 performs Reinforcement Learning (RL) to optimize the control parameters 1001 in real time. The learning algorithm sends the control parameters to the qubit chip environment and observes the sensor outputs to determine how close the system is to the target state. It then adjusts the control parameters with the goal of minimizing the cost function or maximizing the reward function. Different implementations may use model-based or model-free RL frameworks.

Figure 11:
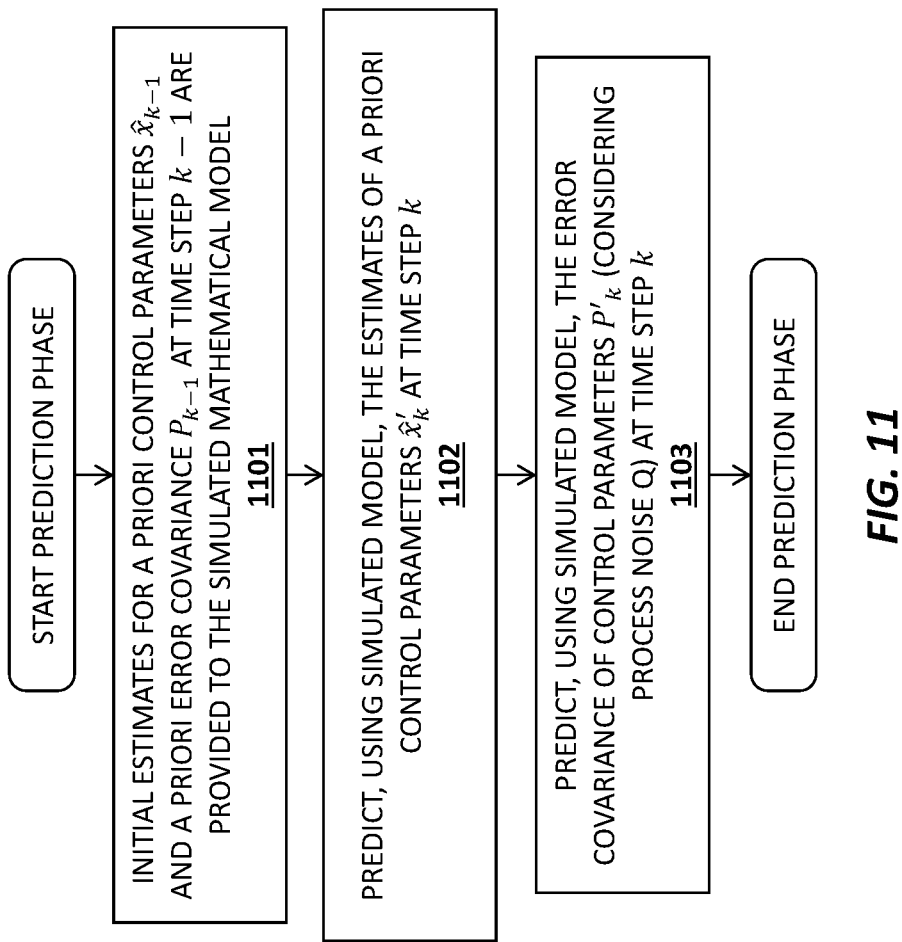
FIG. 11 illustrates one embodiment of a method for predicting qubit control parameters.

One embodiment of a method for performing predictions will be described with respect to FIG. 11. While this method may be implemented on the architectures described above, it is not limited to any specific architecture.

At operation 1101, the initial estimates for a priori control parameters $\hat{x}_{k-1}$ and a priori error covariance $P_{k-1}$ at time step k−1 are provided to the simulated mathematical model. At operation 1102, based on the initial estimates, the simulated model predicts the estimates of a priori control parameters $\hat{x}'_k$ at time step k. At operation 1103, the simulated model predicts the error covariance of control parameters $P'_k$ (considering process noise Q) at time step k.

Figure 12:
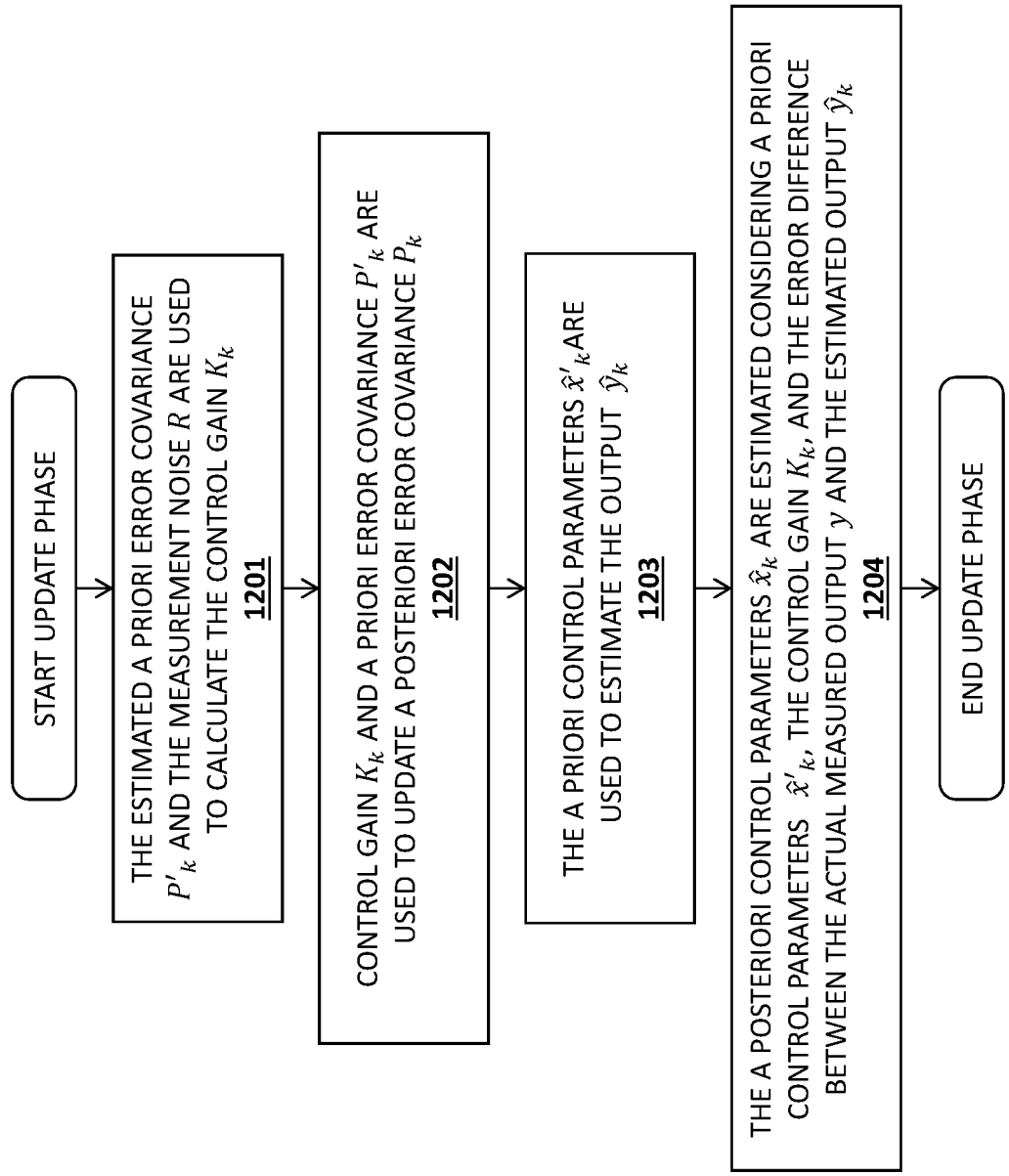
FIG. 12 illustrates one embodiment of a method for updating qubit control parameters.

One embodiment of a method for performing control parameter updates will be described with respect to FIG. 12. While this method may be implemented on the architectures described above, it is not limited to any specific architecture.

At operation 1201, the estimated a priori error covariance $P'_k$ and the measurement noise R are used to calculate the control gain $K_k$ (e.g., the adjustments to be made to the various control parameters). At operation 1202, the control gain $K_k$ and a priori error covariance $P'_k$ are used to update a posteriori error covariance $P_k$. At operation 1203, the a priori control parameters $\hat{x}'_k$ are used to estimate the output $\hat{y}_k$. At operation 1204, the a posteriori control parameters $\hat{x}_k$ are estimated considering a priori control parameters $\hat{x}'_k$, the control gain $K_k$, and the error difference between the actual measured output y and the estimated output $\hat{y}_k$. In one embodiment, the new control parameters $\hat{x}_k$ are then applied to the quantum system, and the process repeats continually as the quantum system continues to execute the quantum program.

While the embodiments of the invention may be implemented in a variety of different contexts, one notable application pertains to the real-time calibration of control parameters of a quantum processor consisting of electrostatically defined confinement-based semiconductor quantum dots. In such a system, the multi-qubit gates are performed by applying finely-calibrated voltage pulses on barrier and plunger gates on the desired quantum dots. Due to capacitive crosstalk, the electrochemical potential and tunnel coupling of nearby quantum dots are affected.

In current implementations, the quantum system is calibrated offline and the effect of cross-capacitance between all gates calculated and encoded in a crosstalk-matrix to generate virtual quantum operations which compensate for the crosstalk. When the system is operating, the precalculated crosstalk-matrix is used to adjust the control parameters of multi-qubit gates. However, after some time, drift causes the virtual gates to lose calibration and multi-qubit gate fidelities decrease. The embodiments of the invention described herein solve the calibration drift problem by considering some quantum dots as sensors to update the virtual gates in real time while an extended quantum algorithm is running.

Another potential application pertains to the real-time calibration of control parameters of a quantum processor consisting of superconducting qubits based on Josephson junctions and flux-tunable superconducting quantum interference devices (SQUIDs). In such a system, multi-qubit gates are typically performed by applying finely-calibrated current pulses on the SQUID loop to either modify the resonance frequency of the qubit or to vary the coupling between two qubits. Due to on-chip crosstalk, the resonance frequencies and coupling strengths of nearby qubits are also affected. The embodiments of the invention solve the calibration drift problem by considering some superconducting qubits or superconducting resonators as sensors to update the compensation in real time while the extended quantum program is running. Hysteresis present in control lines can also be a source of an apparent drift in system parameters, and this invention could mitigate such effects.

In the above detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. Terms like "first," "second," "third," etc. do not imply a particular ordering, unless otherwise specified.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hardwired logic for performing the steps, or by any combination of programmed computer components and custom hardware components.

EXAMPLES

The following are example implementations of different embodiments of the invention.

Example 1. An apparatus comprising: a quantum processor comprising a plurality of qubits, each of the qubits having a state; a quantum controller to generate sequences of electromagnetic (EM) pulses to manipulate the states of the plurality of qubits based on a set of control parameters; a qubit measurement unit to measure one or more sensors associated with a corresponding one or more of the qubits of the plurality of qubits to produce one or more corresponding measured values; and a machine-learning engine to evaluate the one or more measured values in accordance with a machine-learning process to generate updated control parameters, wherein the quantum controller is to use the updated control parameters to generate subsequent sequences of EM pulses to manipulate the states of the plurality of qubits.

Example 2. The apparatus of example 1 wherein the machine-learning engine is to estimate measurement values from the sensors and to determine differences between the measured values and corresponding estimated values to determine the updated control parameters.

Example 3. The apparatus of example 2 wherein the machine-learning engine comprises: a machine-learning estimator to evaluate a set of estimated control parameters to generate the estimated measurement values.

Example 4. The apparatus of example 3 wherein the machine-learning engine further comprises: a simulated quantum model to generate the set of estimated control parameters.

Example 5. The apparatus of example 1 wherein the machine-learning process comprises a reinforcement learning process.

Example 6. The apparatus of example 5 wherein the reinforcement learning process is to generate the estimated control parameters to minimize a cost function or maximize a reward function associated with the measured values and estimated measurement values.

Example 7. The apparatus of example 1 wherein the quantum processor comprises electrostatically defined confinement-based semiconductor quantum dots.

Example 8. The apparatus of example 1 wherein the quantum processor comprises superconducting qubits based on Josephson junctions and flux-tunable superconducting quantum interference devices.

Example 9. The apparatus of example 1 wherein the sensors comprise a first subset of the plurality of qubits, each qubit in the first subset associated with at least one other qubit in a second subset of the plurality of qubits.

Example 10. The apparatus of example 1 wherein the EM pulses comprise DC pulses.

Example 11. A method comprising: generating sequences of electromagnetic pulses to manipulate the states of the plurality of qubits of a quantum processor based on a set of control parameters; measuring one or more sensors associated with a corresponding one or more of the qubits of the plurality of qubits to produce one or more corresponding measured values; and evaluating the one or more measured values in accordance with a machine-learning process; generating updated control parameters based on the machine-learning process; and using the updated control parameters to generate subsequent sequences of pulses to manipulate the states of the plurality of qubits.

Example 12. The method of example 11 wherein the machine-learning process is to estimate measurement values from the sensors and to determine differences between the measured values and corresponding estimated values to determine the updated control parameters.

Example 13. The method of example 12 wherein the machine-learning process further comprises: evaluating a set of estimated control parameters to generate the estimated measurement values.

Example 14. The method of example 13 wherein the machine-learning process further comprises: generating the set of estimated control parameters with a simulated quantum model.

Example 15. The method of example 11 wherein the machine-learning process comprises a reinforcement learning process.

Example 16. The method of example 15 wherein the reinforcement learning process comprises generating the estimated control parameters to minimize a cost function or maximize a reward function associated with the measured values and estimated measurement values.

Example 17. The method of example 11 wherein the quantum processor comprises electrostatically defined confinement-based semiconductor quantum dots.

Example 18. The method of example 11 wherein the quantum processor comprises superconducting qubits based on Josephson junctions and flux-tunable superconducting quantum interference devices.

Example 19. A machine-readable medium having program code stored thereon which, when executed by a machine, causes the machine to perform the operations of: generating sequences of electromagnetic (EM) pulses to manipulate the states of the plurality of qubits of a quantum processor based on a set of control parameters; measuring the one or more sensors associated with a corresponding one or more of the qubits of the plurality of qubits to produce one or more corresponding measured values; and evaluating the one or more measured values in accordance with a machine-learning process; generating updated control parameters based on the machine-learning process; and using the updated control parameters to generate subsequent sequences of pulses to manipulate the states of the plurality of qubits.

Example 20. The machine-readable medium of example 19 wherein the machine-learning process is to estimate measurement values for the qubit states and to determine differences between the measured values and corresponding estimated values to determine the updated control parameters.

Example 21. The machine-readable medium of example 20 wherein the machine-learning process further comprises: evaluating a set of estimated control parameters to generate the estimated measurement values.

Example 22. The machine-readable medium of example 21 wherein the machine-learning process further comprises: generating the set of estimated control parameters with a simulated quantum model.

Example 23. The machine-readable medium of example 19 wherein the machine-learning process comprises a reinforcement learning process.

Example 24. The machine-readable medium of claim 23 wherein the reinforcement learning process comprises generating the estimated control parameters to minimize a cost function or maximize a reward function associated with the measured values and estimated measurement values.

Example 25. The machine-readable medium of claim 19 wherein the quantum processor comprises electrostatically defined confinement-based semiconductor quantum dots.

Example 26. The machine-readable medium of claim 19 wherein the quantum processor comprises superconducting qubits based on Josephson junctions and flux-tunable superconducting quantum interference devices.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.).

In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

What is claimed is:

1. An apparatus comprising:
    a quantum processor comprising a plurality of qubits, each of the qubits having a state;
    a quantum controller to generate sequences of electromagnetic (EM) pulses to manipulate the states of the plurality of qubits based on a set of control parameters;
    a qubit measurement unit to measure one or more sensors associated with a corresponding one or more of the qubits of the plurality of qubits to produce one or more corresponding measured values; and
    a machine-learning engine to evaluate the one or more measured values in accordance with a machine-learning process to generate updated control parameters, wherein the quantum controller is to use the updated control parameters to generate subsequent sequences of EM pulses to manipulate the states of the plurality of qubits.

2. The apparatus of claim 1 wherein the machine-learning engine is to estimate measurement values from the sensors and to determine differences between the measured values and corresponding estimated values to determine the updated control parameters.

3. The apparatus of claim 2 wherein the machine-learning engine comprises:
    a machine-learning estimator to evaluate a set of estimated control parameters to generate the estimated measurement values.

4. The apparatus of claim 3 wherein the machine-learning engine further comprises:
    a simulated quantum model to generate the set of estimated control parameters.

5. The apparatus of claim 1 wherein the machine-learning process comprises a reinforcement learning process.

6. The apparatus of claim 5 wherein the reinforcement learning process is to generate the estimated control parameters to minimize a cost function or maximize a reward function associated with the measured values and estimated measurement values.

7. The apparatus of claim 1 wherein the quantum processor comprises electrostatically defined confinement-based semiconductor quantum dots.

8. The apparatus of claim 1 wherein the quantum processor comprises superconducting qubits based on Josephson junctions and flux-tunable superconducting quantum interference devices.

9. The apparatus of claim 1 wherein the sensors comprise a first subset of the plurality of qubits, each qubit in the first subset associated with at least one other qubit in a second subset of the plurality of qubits.

10. The apparatus of claim 1 wherein the EM pulses comprise DC pulses.

11. A method comprising:
    generating sequences of electromagnetic pulses to manipulate the states of the plurality of qubits of a quantum processor based on a set of control parameters;
    measuring one or more sensors associated with a corresponding one or more of the qubits of the plurality of qubits to produce one or more corresponding measured values; and
    evaluating the one or more measured values in accordance with a machine-learning process;
    generating updated control parameters based on the machine-learning process; and
    using the updated control parameters to generate subsequent sequences of pulses to manipulate the states of the plurality of qubits.

12. The method of claim 11 wherein the machine-learning process is to estimate measurement values from the sensors and to determine differences between the measured values and corresponding estimated values to determine the updated control parameters.

13. The method of claim 12 wherein the machine-learning process further comprises:
    evaluating a set of estimated control parameters to generate the estimated measurement values.

14. The method of claim 13 wherein the machine-learning process further comprises:
    generating the set of estimated control parameters with a simulated quantum model.

15. The method of claim 11 wherein the machine-learning process comprises a reinforcement learning process.

16. The method of claim 15 wherein the reinforcement learning process comprises generating the estimated control parameters to minimize a cost function or maximize a reward function associated with the measured values and estimated measurement values.

17. The method of claim 11 wherein the quantum processor comprises electrostatically defined confinement-based semiconductor quantum dots.

18. The method of claim 11 wherein the quantum processor comprises superconducting qubits based on Josephson junctions and flux-tunable superconducting quantum interference devices.

19. A machine-readable medium having program code stored thereon which, when executed by a machine, causes the machine to perform the operations of:
- generating sequences of electromagnetic (EM) pulses to manipulate the states of the plurality of qubits of a quantum processor based on a set of control parameters;
- measuring the one or more sensors associated with a corresponding one or more of the qubits of the plurality of qubits to produce one or more corresponding measured values; and
- evaluating the one or more measured values in accordance with a machine-learning process;
- generating updated control parameters based on the machine-learning process; and
- using the updated control parameters to generate subsequent sequences of pulses to manipulate the states of the plurality of qubits.

20. The machine-readable medium of claim 19 wherein the machine-learning process is to estimate measurement values for the qubit states and to determine differences between the measured values and corresponding estimated values to determine the updated control parameters.

21. The machine-readable medium of claim 20 wherein the machine-learning process further comprises:
- evaluating a set of estimated control parameters to generate the estimated measurement values.

22. The machine-readable medium of claim 21 wherein the machine-learning process further comprises:
- generating the set of estimated control parameters with a simulated quantum model.

23. The machine-readable medium of claim 19 wherein the machine-learning process comprises a reinforcement learning process.

24. The machine-readable medium of claim 23 wherein the reinforcement learning process comprises generating the estimated control parameters to minimize a cost function or maximize a reward function associated with the measured values and estimated measurement values.

25. The machine-readable medium of claim 19 wherein the quantum processor comprises electrostatically defined confinement-based semiconductor quantum dots.

26. The machine-readable medium of claim 19 wherein the quantum processor comprises superconducting qubits based on Josephson junctions and flux-tunable superconducting quantum interference devices.

* * * * *